(12) United States Patent
Tabira et al.

(10) Patent No.: US 7,224,045 B2
(45) Date of Patent: May 29, 2007

(54) LEADLESS TYPE SEMICONDUCTOR PACKAGE, AND PRODUCTION PROCESS FOR MANUFACTURING SUCH LEADLESS TYPE SEMICONDUCTOR PACKAGE

(75) Inventors: Yukinori Tabira, Kanagawa (JP); Takekazu Tanaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/869,949

(22) Filed: Jun. 18, 2004

(65) Prior Publication Data

US 2005/0023658 A1  Feb. 3, 2005

(30) Foreign Application Priority Data

Jul. 31, 2003  (JP) .............................. 2003-283264

(51) Int. Cl.
     *H01L 23/495* (2006.01)
(52) U.S. Cl. ....................... 257/666; 257/778
(58) Field of Classification Search ................ 257/718, 257/720, 712, 796, 730, 787
See application file for complete search history.

(56) References Cited

U.S. PATENT DOCUMENTS

| 6,376,921 | B1 | 4/2002 | Yoneda et al. |
| 6,573,121 | B2 | 6/2003 | Yoneda et al. |
| 6,693,350 | B2 | 2/2004 | Teshima et al. |
| 6,703,707 | B1 | 3/2004 | Mamitsu et al. |
| 6,798,062 | B2 | 9/2004 | Mamitsu et al. |
| 6,891,265 | B2 | 5/2005 | Mamitsu et al. |
| 2001/0048116 | A1 | 12/2001 | Standing et al. |
| 2001/0048154 | A1 | 12/2001 | Cheah et al. |
| 2002/0027276 | A1 | 3/2002 | Yoneda et al. |

FOREIGN PATENT DOCUMENTS

| JP | 59-143348 A | 8/1984 |
| JP | 11-150143 | 6/1999 |
| JP | 2001-156219 A | 6/2001 |
| JP | 2001-291823 A | 10/2001 |
| JP | 2001-313362 A | 11/2001 |
| JP | 2002-110893 A | 4/2002 |
| WO | WO 03/036717 A1 | 5/2003 |

*Primary Examiner*—Howard Weiss
*Assistant Examiner*—Vikki H. Trinh
(74) *Attorney, Agent, or Firm*—Foley & Lardner LLP

(57) ABSTRACT

A leadless type semiconductor package includes a plate-like mount, and at least one semiconductor chip mounted on the plate-like mount such that a bottom surface of the semiconductor chip is secured to the plate-like mount, and the semiconductor chip has at least one electrode pad formed on a top surface thereof. The package further includes at least one flat electrode electrically connected to the electrode pad, and a molded resin enveloper for completely sealing and encapsulating the semiconductor chip. The molded resin enveloper further partially seals and encapsulates the flat electrode such that a part of the flat electrode is exposed as an outer electrode pad on a top surface of the molded resin enveloper.

18 Claims, 16 Drawing Sheets

LEADLESS TYPE SEMICONDUCTOR PACKAGE, AND PRODUCTION PROCESS FOR MANUFACTURING SUCH LEADLESS TYPE SEMICONDUCTOR PACKAGE

BACKGROUND OF THE INVENTION

1. Field of the Invention

The present invention relates to a leadless type semiconductor package having no outer leads outwardly extending from a periphery thereof, and a production process for manufacturing such a leadless type semiconductor package.

2. Description of the Related Art

Conventionally, a semiconductor package includes an island or plate-like mount, a semiconductor chip mounted on the plate-like mount, a plurality of leads electrically connected to the semiconductor chip, and a molded resin enveloper sealing and encapsulating the plate-like mount, the semiconductor chip, and the inner portions of the leads. Thus, the outer portions of the leads outwardly and laterally extend from sides of the molded resin enveloper, and the conventional semiconductor package is mounted on a wiring board such that the outer portions of the leads are electrically contacted with and bonded to electrode pads formed on the wiring board. Of course, this conventional semiconductor package is undesirable in application to a miniature or compact piece of electronic equipment in that the outwardly and laterally extending outer portions of the leads result in overall bulkiness of the semiconductor package.

JP-A-(HEI)11-150143 (Japanese Letters Patent No. 3074264) discloses a leadless type semiconductor package more compactly arranged in comparison with the aforesaid conventional semiconductor package. In particular, the leadless type semiconductor package includes an island or plate-like mount, a semiconductor chip mounted on the plate-like mount having electrode pads provided on a top surface thereof, a molded resin enveloper sealing and encapsulating the semiconductor chip, and metal electrode pads provided on a rear surface of the molded resin enveloper and electrically connected to the electrode pads of the semiconductor chip through the intermediary of bonding wires.

The leadless type semiconductor package is mounted on a wiring board such that the metal electrode pads of the molded resin enveloper are electrically contacted with and bonded to electrode pads formed on the wiring board.

The leadless type semiconductor package is more compact in comparison with the first-mentioned conventional semiconductor package because this semiconductor package has no outer lead portions extending outwardly and laterally from sides of the molded resin enveloper. Nevertheless, the leadless type semiconductor package necessarily has a relatively large thickness in that the bonding wires are used to establish the electrical connection between the electrode pads of the semiconductor chip and the metal electrode pads of the resin molded enveloper. Namely, it is necessary to provide a relatively high space for the laying of the bonding wires, resulting in the large thickness of the leadless type semiconductor package itself.

SUMMARY OF THE INVENTION

Therefore, an object of the present invention is to provide a leadless type semiconductor package which is arranged such that a thickness of the package itself can be significantly reduced.

Another object of the present invention is to provide a production process for manufacturing the above-mentioned leadless type semiconductor package.

In accordance with a first aspect of the present invention, there is provided a leadless type semiconductor package comprising a plate-like mount, and at least one semiconductor chip mounted on the plate-like mount such that a bottom surface of the semiconductor chip is secured to the plate-like mount, and the semiconductor chip has at least one electrode pad formed on a top surface thereof. The leadless type semiconductor package further comprises at least one flat electrode electrically connected to the electrode pad, and a molded resin enveloper that completely seals and encapsulates the semiconductor chip, and that partially seals and encapsulates the flat electrode such that a part of the flat electrode is exposed as an outer electrode pad on a top surface of the molded resin enveloper.

Preferably, the flat electrode is formed with a land portion, which is exposed as the outer electrode pad on the top surface of the molded resin enveloper.

The flat electrode may be produced by etching a flat electrode blank, having substantially the same configuration as the flat electrode, such that the land portion is left on the flat electrode blank.

The plate-like mount may be formed of a conductive material. In this case, the semiconductor chip has an electrode layer formed on the bottom surface thereof, and the electrode layer is electrically connected to the plate-like mount. The plate-like mount may be at least partially exposed from the molded resin enveloper to thereby provide an outer electrode surface.

Preferably, the plate-like mount is formed with a land portion, which is exposed on the bottom surface of the molded resin enveloper for the provision of the outer electrode surface.

The plate-like mount may be produced by etching a plate-like mount blank, having substantially the same configuration as the plate-like mount, such that the land portion is left on the plate-like mount blank.

When the aforesaid electrode pad and the aforesaid flat electrode are defined as a first electrode pad and a first flat electrode pad, respectively, the semiconductor chip may further have a second electrode pad formed on the top surface thereof, and a second flat electrode electrically connected to the second electrode pad.

In this case, when the semiconductor chip is formed as a vertical type power metal oxide semiconductor field effect transistor device, the electrode layer is defined as a drain electrode, and the respective first and second flat electrodes are defined as a source electrode and a gate electrode.

Also, when the aforesaid semiconductor chip is defined as a first semiconductor chip, a second semiconductor chip, which is substantially identical to the first semiconductor chip, may be sealed and encapsulated in the molded resin enveloper in substantially the same manner as the first semiconductor chip. On the other hand, the second semiconductor chip may be different from the first semiconductor chip. In this case, the second semiconductor chip may have at least one an electrode layer formed thereon, and a flat electrode electrically connected to the electrode layer, a part of which is exposed as an outer electrode pad from the molded resin enveloper.

In accordance with a second aspect of the present invention, there is provided a production process for manufacturing a plurality of leadless type semiconductor packages, which comprises the steps of: preparing a first metal frame including a plurality of plate-like mounts; preparing a plurality of semiconductor chips, each of which has at least one electrode pad formed on a top surface thereof; mounting the respective semiconductor chips on the plate-like mounts such that a bottom surface of each of the semiconductor chips is securely bonded thereto; preparing a second metal frame including a plurality of flat electrodes; applying the second metal frame to the first metal frame such that the respective flat electrodes are placed on and bonded to the electrode pads of the semiconductor chips so as to establish electrical connections therebetween, resulting in production of an intermediate product including the first and second metal frames and the semiconductor chips provided therebetween; receiving the intermediate product in a molding cavity defined by mold dies; introducing an uncured resin material into the molding cavity to thereby form a molded resin enveloper that completely seals and encapsulates the semiconductor chips, and that partially seals and encapsulates the flat electrodes such that a part of each of the flat electrodes is exposed as an outer electrode pad on a top surface of the molded resin enveloper; removing the molded resin enveloper from the mold dies after the introduced resin material is cured; and cutting and dividing the molded resin enveloper into a plurality of leadless type semiconductor packages, each of the leadless type semiconductor packages including one of the plate-like mounts, a semiconductor chip mounted thereon, and a flat electrode bonded to an electrode pad thereof.

In this production process, the bonding of the respective flat electrodes to the electrode pads of the semiconductor chips may be carried out prior to the bonding of the respective bottom surfaces of the semiconductor chips to the plate-like mounts of the first metal frame.

Preferably, each of the flat electrodes is formed with a land portion, which is exposed as the outer electrode pad on the top surface of the molded resin enveloper. In this case, the second metal frame may be produced by etching an intermediate product, having substantially the same configuration as the second metal frame and including a plurality of flat electrode blanks corresponding to the respective flat electrodes, such that each of the land portions is left on a corresponding flat electrode blank.

In accordance with a third aspect of the present invention, there is provided a production process for manufacturing a plurality of leadless type semiconductor packages, comprising the steps of: preparing a first metal frame including a plurality of plate-like mounts; preparing a plurality of first semiconductor chips, each of which has at least one electrode pad formed on a top surface thereof; mounting the respective first semiconductor chips on the plate-like mounts such that a bottom surface of each of the first semiconductor chips is securely bonded thereto; preparing a second metal frame including plural sets of first and second flat electrodes; preparing a plurality of second semiconductor chips, each of which has at least one electrode pad formed on a top surface thereof; mounting the respective second semiconductor chips on the plate-like mounts of the first metal frame such that the electrode pad each of the second semiconductor chips is securely bonded thereto; combining the first and second metal frames with each other such that the electrode pad of each of the first semiconductor chips is bonded to a corresponding first flat electrode of the second metal frame so as to establish an electrical connection therebetween, and such that a bottom surface of each of the second semiconductor chips is bonded to a corresponding second flat electrode so as to establish an electrical connection therebetween, resulting in production of an intermediate product including the first and second metal frames and the first and second semiconductor chips provided therebetween; receiving the intermediate product in a molding cavity defined by mold dies; introducing an uncured resin material into the molding cavity to thereby form a molded resin enveloper that completely seals and encapsulates the first and second semiconductor chips, and that partially seals and encapsulates the first and second flat electrodes such that a part of each of the first and second flat electrodes is exposed as an outer electrode pad on a top surface of the molded resin enveloper; removing the molded resin enveloper from the mold dies after the introduced resin material is cured; and cutting and dividing the molded resin enveloper into a plurality of leadless type semiconductor packages, each of the leadless type semiconductor packages including one of the plate-like mounts, both first and second semiconductor chips mounted thereon, and both first and second flat electrode bonded to the respective electrode pads thereof.

In the third aspect of the present invention, each of the plate-like mounts may be is formed with a land portion, which is exposed as an outer electrode pad on a bottom surface of the molded resin enveloper. In this case, preferably, the first metal frame is produced by etching an intermediate product, having substantially the same configuration as the first metal frame and including a plurality of plate-like blanks corresponding to the respective plate-like mounts, such that each of the land portions (L) is left on a corresponding plate-like blank.

Also, in the third aspect of the present invention, each of the first and second flat electrodes may be formed with a land portion, which is exposed as the outer electrode pad on the top surface of the molded resin enveloper. In this case, preferably, the second metal frame is produced by etching an intermediate product, having substantially the same configuration as the second metal frame and including plural sets of first and second flat electrode blanks corresponding to the respective plural sets of first and second flat electrodes, such that each set of first and second land portions are left on a corresponding flat electrode blank.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Before descriptions of embodiments of the present invention, for better understanding of the present invention, a conventional leadless type semiconductor package will be explained with reference to FIGS. 1, 2, 3 and 4.

Figure 1:
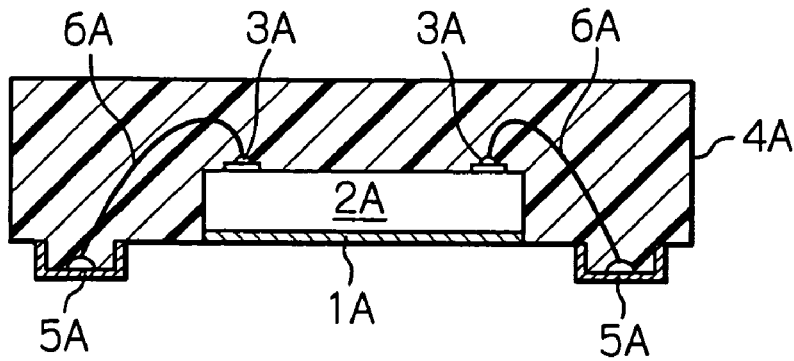
FIG. 1 is a longitudinal cross-sectional view showing a first conventional leadless type semiconductor package.

First, with reference to FIG. 1, a first conventional leadless type semiconductor package, as disclosed in the above-mentioned JP-A-(HEI)11-150143, is illustrated.

The first conventional leadless type semiconductor package includes an island or plate-like mount 1A, a semiconductor chip 2A mounted on the plate-like mount 1A and having electrode pads 3A provided on a top surface thereof, and a molded resin enveloper 4A sealing and encapsulating the semiconductor chip 2A such that the plate-like mount 1A is exposed on the rear surface of the molded resin enveloper 4A. As shown in FIG. 1, the molded resin enveloper 4A has protrusions protruding from the rear surface thereof, and each of the protrusions is covered with a cap-like metal electrode pad 5A. The electrode pads 3A of the semiconductor chip 2A are electrically connected to the cap-like metal electrode pads 5A through the intermediary of bonding wires 6A.

In reality, in production of the first conventional leadless type semiconductor package, the plate-like mount 1A and the cap-like metal electrode pads 5A are prepared in the form of a metal lead frame. Then, after the semiconductor chip 2A is mounted on the plate-like mount 1A, the bonding wires 6A are provided between the electrodes pads 3A and the cap-like electrode pads 5A, using a wire-bonding machine, and the molded resin enveloper 4A is formed from a suitable resin material, such as epoxy, using a pair of mold dies.

As is apparent from FIG. 1, the first conventional leadless type semiconductor package has no outer lead portions extending outwardly and laterally from the sides of the molded resin enveloper 4A, but it inevitably has a relatively large thickness for the provision of the bonding wires 6A.

Figure 2:
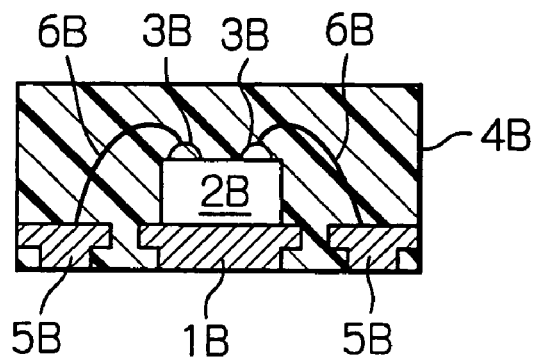
FIG. 2 is a longitudinal cross-sectional view showing a second conventional leadless type semiconductor package.

With reference to FIG. 2, a second conventional leadless type semiconductor package is illustrated. The second conventional leadless type semiconductor package also includes an island or mount 1B, a semiconductor chip 2B mounted on the mount 1B and having electrode pads 3B provided on a top surface thereof, and a molded resin enveloper 4B sealing and encapsulating the semiconductor chip 2B such that the island 1B is exposed on the rear surface of the molded resin enveloper 4B. As shown in FIG. 2, metal electrodes 5B are embedded in the molded resin enveloper 4B so as to be exposed on the rear surface thereof, and are electrically connected to the electrode pads 3B of the semiconductor chip 2B through the intermediary of bonding wires 6B.

Similar to the first conventional leadless type semiconductor package, in production of the second conventional leadless type semiconductor package, the mount 1B and the metal electrodes 5B are prepared in the form of a metal lead frame. Then, the semiconductor chip 2B is mounted on the island 1A. Then, the bonding wires 6B are provided between the electrodes pads 3B and the metal electrodes 5B, using a wire-bonding machine, and the molded resin enveloper 4B is formed from a suitable resin material, such as epoxy, using a pair of mold dies.

As is apparent from FIG. 2, the second conventional leadless type semiconductor package also has no outer lead portions extending outwardly and laterally from the sides of the molded resin enveloper 4B, but it inevitably has a relatively large thickness for the provision of the bonding wires 6B.

In the above-mentioned first and second conventional leadless type semiconductor packages featuring the bonding wires (6A, 6B), it is difficult to achieve a high speed operation because the bonding wires (6A, 6B) are very thin and thus exhibit a relatively large electrical resistance.

Figure 3:
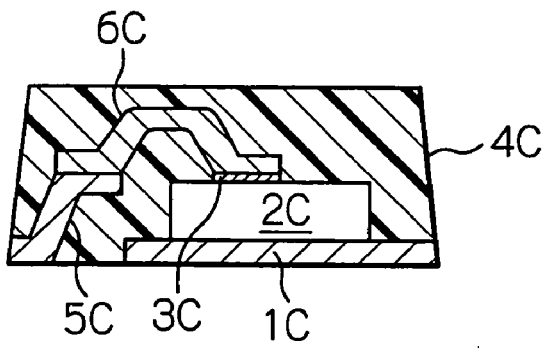
FIG. 3 is a longitudinal cross-sectional view showing a third conventional leadless type semiconductor package.

In order to ensure the high speed operation in a leadless type semiconductor package, it has been proposed that a thick metal lead is substituted for a bonding wire, as shown in FIG. 3 in which a third conventional leadless type semiconductor package is illustrated.

In particular, the third conventional leadless type semiconductor package includes an island or plate-like mount 1C, a semiconductor chip 2C mounted on the plate-like mount 1C and having an electrode pad 3C provided on a top surface thereof, and a molded resin enveloper 4C sealing and encapsulating the semiconductor chip 2C such that the plate-like mount 1C is exposed on the rear surface of the molded resin enveloper 4C. As shown in FIG. 3, a first shaped metal lead 5C and a second shaped metal lead 6C are embedded in the molded resin enveloper 4C such that one end portion of the first shaped metal lead 5C is exposed as an electrode on the rear surface of the molded resin enveloper 4C, and the other end portion of the first shaped metal lead 5C is electrically connected to the electrode pad 3C of the semiconductor chip 2C through the intermediary of the second shaped metal lead element 6C.

In reality, in production of the third conventional leadless type semiconductor package, the plate-like mount 1C and the first shaped metal lead 5C are prepared in the form of a metal lead frame. Then, after the semiconductor chip 2C is mounted on the plate-like mount 1C, the second shaped metal lead 6C is provided between the electrodes pad 3C and the other end portion of the first shaped metal lead 5C, and the molded resin enveloper 4C is formed from a suitable resin material, such as epoxy, using a pair of mold dies.

According to the third conventional leadless type semiconductor package, since the first and second shaped metal leads 5C and 6C are considerably thicker in comparison with the bonding wires (6A, 6B), i.e. since an electrical resistance of the first and second shaped metal leads 5C and 6C is smaller than that of the bonding wires (6A, 6B), high speed operation is ensured. Nevertheless, the third conventional leadless type semiconductor package also has a relatively large thickness for the provision of the first and second shaped metal leads 5C and 6C.

Figure 4:
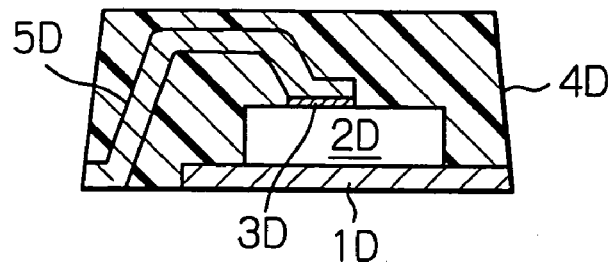
FIG. 4 is a longitudinal cross-sectional view showing a fourth conventional leadless type semiconductor package.

FIG. 4 shows a fourth conventional leadless type semiconductor package, in which the high speed operation is allowed.

In particular, similar to the third conventional leadless type semiconductor package, the fourth conventional leadless type semiconductor package includes an island or plate-like mount 1D, a semiconductor chip 2D mounted on the plate-like mount 1D and having an electrode pad 3D provided on a top surface thereof, and a molded resin enveloper 4D sealing and encapsulating the semiconductor chip 2D such that the plate-like mount 1D is exposed on the rear surface of the molded resin enveloper 4D. As shown in FIG. 4, a shaped metal lead 5D is embedded in the molded resin enveloper 4D such that one end portion of the shaped metal lead 5D is exposed as an electrode on the rear surface of the molded resin enveloper 4D, and the other end portion of the shaped metal lead 5D is electrically and directly connected to the electrode pad 3D of the semiconductor chip 2D.

In reality, in production of the fourth conventional leadless type semiconductor package, the plate-like mount 1D and the shaped metal lead 5D are prepared in the form of a metal lead frame. Then, after the semiconductor chip 2D is mounted on the plate-like mount 1D, the electrical connection is established between the electrode pad 3D and the other end portion of the shaped metal lead 5D, and the molded resin enveloper 4D is formed from a suitable resin material, such as epoxy, using a pair of mold dies.

According to the fourth conventional leadless type semiconductor package, since the shaped metal lead 5D is considerably thicker than the bonding wires (6A, 6B), i.e. since an electrical resistance of the shaped metal lead 5D is smaller than that of the bonding wires (6A, 6B), high speed operation is ensured. Nevertheless, the fourth conventional leadless type semiconductor package also has a relatively large thickness for the provision of the shaped metal lead 5D.

According to the present invention, it is possible to considerably decrease a thickness of a leadless type semiconductor package, as stated below.

Figure 5:
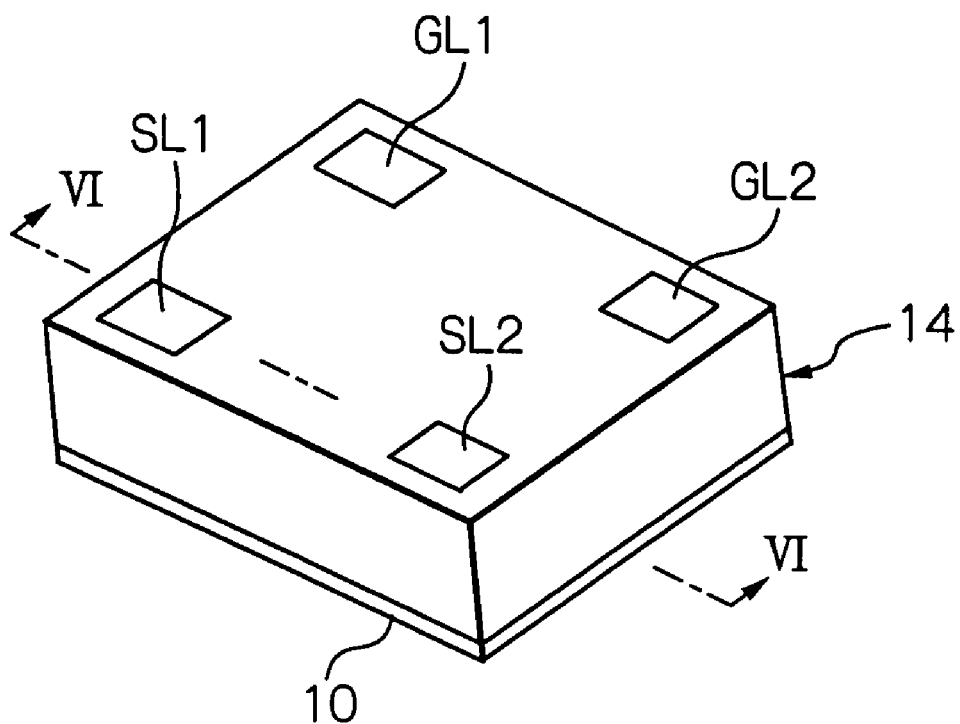
FIG. 5 is a perspective view of a first embodiment of a leadless type semiconductor package according to the present invention.
Figure 6:
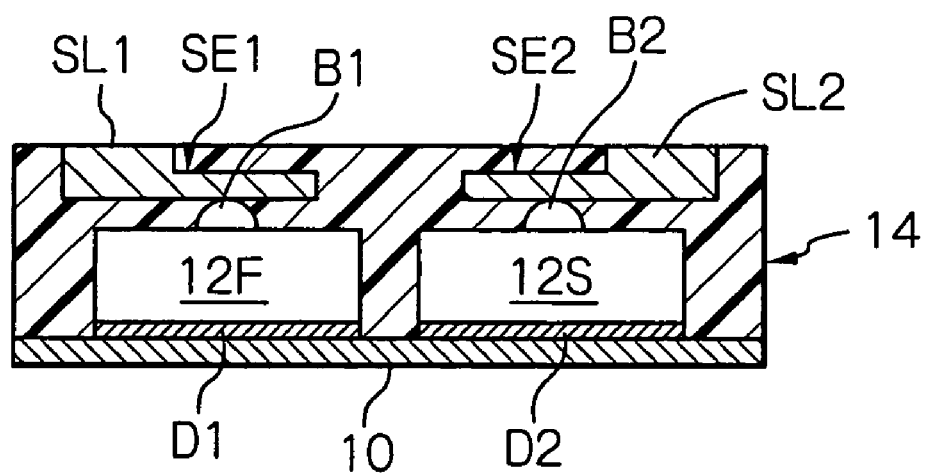
FIG. 6 is a cross-sectional view taken along the VI—VI line of FIG. 5.
Figure 7:
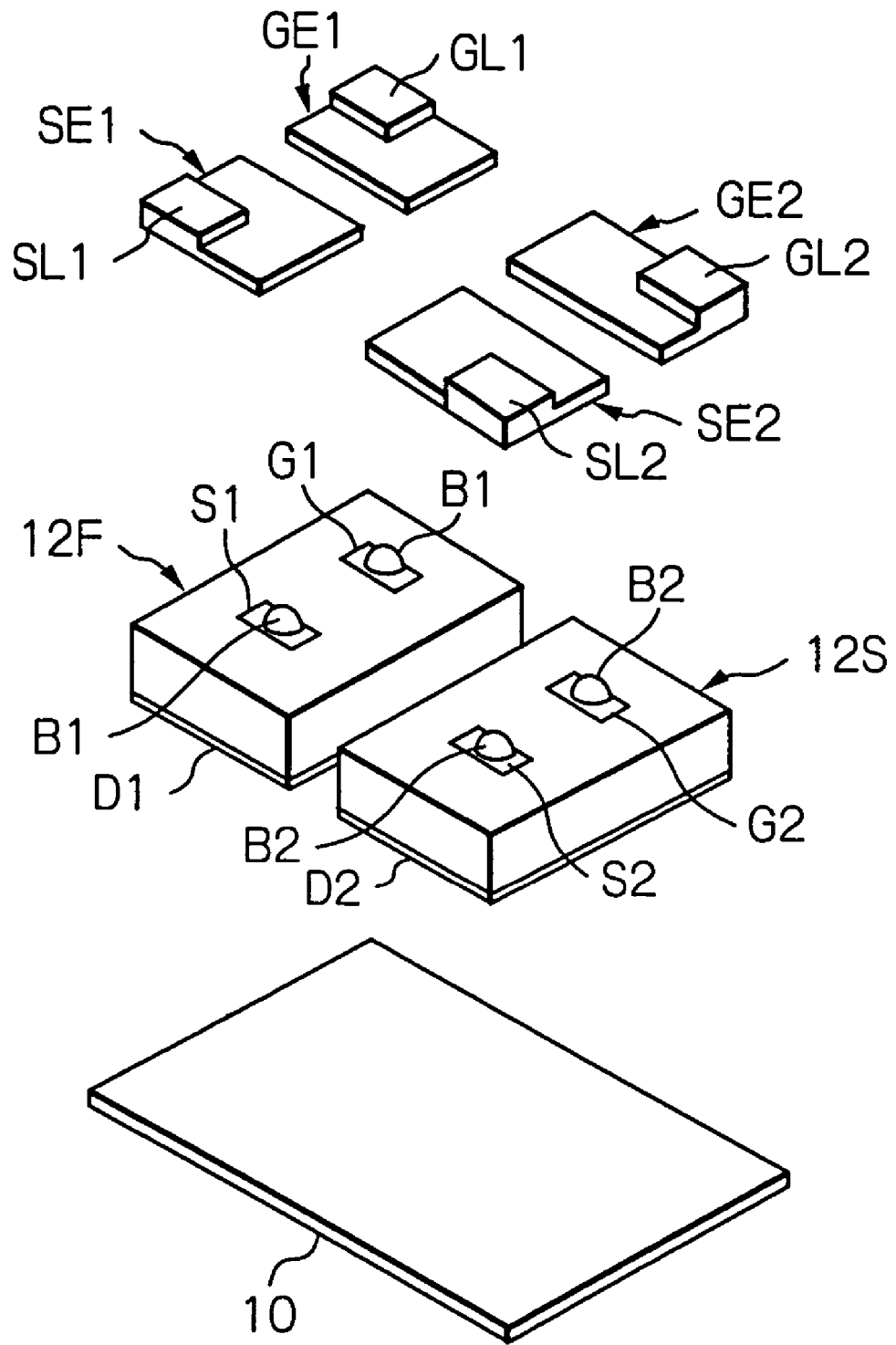
FIG. 7 is an exploded view of elements forming the leadless type semiconductor package shown in FIGS. 5 and 6.

With reference to FIGS. 5, 6 and 7, a first embodiment of a leadless type semiconductor package according to the present invention is illustrated.

As is apparent from FIGS. 5, 6 and 7, the leadless type semiconductor package includes a rectangular metal plate-like mount 10, and first and second semiconductor chips 12F and 12S securely mounted on the plate-like mount 10. For example, the plate-like mount 10 may be formed of a suitable metal material, such as copper, brass or the like. In this first embodiment, the first and second semiconductor chips 12F and 12S are identical to each other, and each of the semiconductor chips 12F and 12S is formed as a vertical type power metal oxide semiconductor field effect transistor (MOSFET) device.

As best shown in FIG. 7, the first semiconductor chip 12F has a drain electrode layer D1 formed over a bottom surface thereof, and both source and gate electrode pads S1 and G1 formed on a top surface of the first semiconductor chip 12F. Similarly, the second semiconductor chip 12S has a drain electrode layer D2 formed over a bottom surface thereof, and both source and gate electrode pads S2 and G2 formed on a top surface of the second semiconductor chip 12S. The drain electrode layers D1 and D2 and the electrode pads S1, S2, G1 and G2 may be formed of a suitable metal material, such as aluminum. For example, the drain electrode layers D1 and D2 are soldered to the plate-like mount 10, using a suitable solder paste, such as a silver paste, and thus the plate-like mount 10 functions as a common drain electrode for the first and second semiconductor chips or vertical type power MOSFET devices 12F and 12S.

Respective metal bumps B1 are provided on and bonded to the electrode pads S1, and G1 of the first semiconductor chip 12F, and respective metal bumps B2 are provided on and bonded to the electrode pads S2, and G2 of the second semiconductor chip 12S. Each of the bumps B1 and B2 is preferably formed of gold, and the bonding of each bump to a corresponding pad (S1, G1, S2, G2) may be carried out by using either an ultrasonic-pressure bonding method or a heat-pressure bonding method. Note, each of the metal bumps B1 and B2 may be replaced with a solder ball, if necessary.

As is apparent from FIGS. 6 and 7, respective rectangular flat source and gate electrodes SE1 and GE1, which are formed of a suitable metal material, such as copper, brass or the like, are provided on and bonded to the metal bumps B1 on the source and gate electrode pads S1 and G1. Similarly, respective flat rectangular source and gate electrodes SE2 and GE 2, which are formed of a suitable metal material, such as copper, brass or the like, are provided on and bonded to the metal bumps B on the source and gate electrode pads S2 and G2.

Note, the bonding of the flat electrodes SE1, GE1, SE2 and GE2 to the metal bumps B2 may be carried out by using either an ultrasonic-pressure bonding method or a heat-pressure bonding method. As best shown in FIG. 7, the rectangular flat source electrode SE1 has a rectangular land portion SL1 provided at one corner thereof, and the rectangular flat gate electrode GE1 has a rectangular land portion GL1 provided at one corner thereof. Similarly, the rectangular flat source electrode SE2 has a rectangular land portion SL2 provided at one corner thereof, and the rectangular flat gate electrode GE2 has a rectangular land portion GL2 provided at one corner thereof.

As shown in FIGS. 5 and 6, the leadless type semiconductor package further includes a molded resin enveloper 14 sealing and encapsulating the first and second semiconductor chips 12F and 12S and the flat electrodes SE1, GE1, SE2 and GE2, such that the rectangular land portions SL1, GL1, SL2 and GL2 of the flat electrodes SE1, GE1, SE2 and GE2 are exposed on a top surface of the molded resin enveloper 14. The respective exposed land portions SL1 and GL1 serve as an outer source electrode pad and an outer gate electrode pad for the first semiconductor chip 12F, and the respective exposed land portions SL2 and GL2 serve as an outer source electrode pad and an outer gate electrode pad for the second semiconductor chip 12S.

As is apparent from FIGS. 6 and 7, the flat electrodes SE1, GE1, SE2 and GE2 can be more compactly provided and arranged above the first and second semiconductor chips 12F and 12S in comparison with the conventional leadless semiconductor packages (FIGS. 1 to 4), and thus it is possible to considerably reduce a thickness of the molded resin enveloper 14, and therefore, an entire thickness of the leadless type semiconductor package according to the present invention can be reduced.

Figure 8:
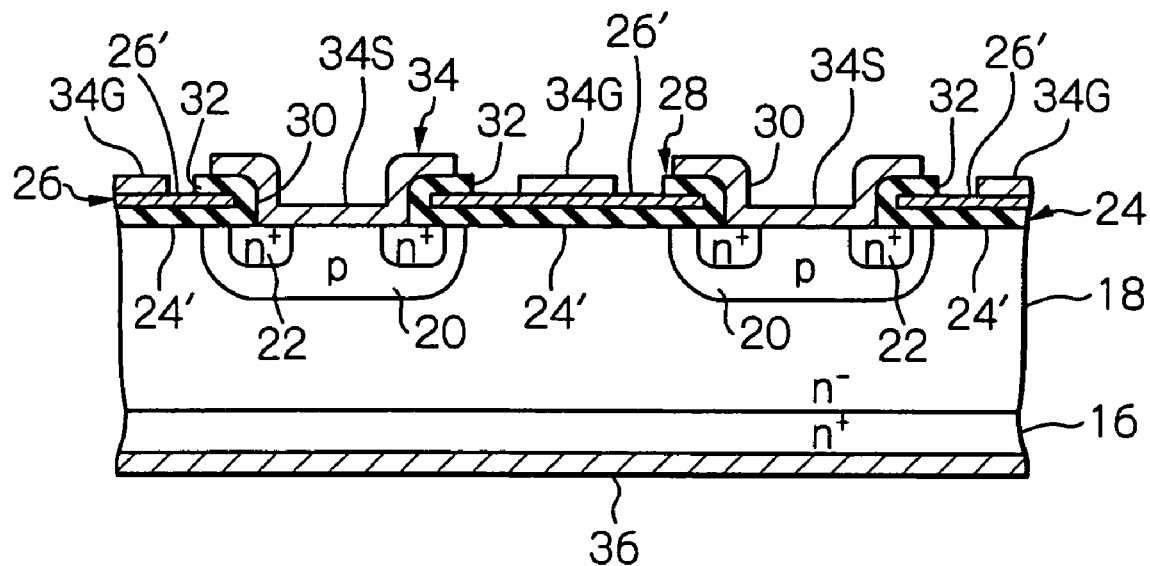
FIG. 8 is a cross-sectional view of a product in which a plurality of vertical type power metal oxide semiconductor field effect transistor (MOSFET) devices are produced, each of the power MOSFET devices being used as a semiconductor chip in the leadless type semiconductor package according to the present invention.

With reference to FIG. 8, production of vertical type power MOSFET devices (12F, 12S) is illustrated.

In particular, first, an $N^+$-type semiconductor substrate 16, which may be obtained from an $n^+$-type monocrystalline silicon wafer, is prepared, and an n-type epitaxial layer 18 is formed as a drift layer on the $n^+$-type semiconductor substrate 16. Then, a plurality of p-type base regions 20 are formed at a given pitch in the n-type drift layer 18 by implanting p-type impurities, such as boron ions ($B^+$) or the like therein, and an annular $n^+$-type source region 22 is formed in each of the p-type base regions 20 by implanting N-type impurities, such as phosphorus ions ($P^+$) or the like therein.

Thereafter, a silicon dioxide layer 24 is formed over the N-type drift layer 18, and is patterned such that a gate insulating layer 24' is defined between two adjacent annular $N^+$-type source regions 22. Then, a polycrystalline silicon layer 26 is formed over the patterned gate insulating layer 24, and is patterned such that a gate electrode layer 26' is defined on each of the gate insulating layers 24'. Subsequently, a silicon dioxide layer 28 is formed as an insulating interlayer over the patterned polycrystalline silicon layer 26, and a plurality of source contact holes 30 and a plurality of gate contact holes 32 are perforated in the insulating interlayer 28 such that the annular $N^+$-type source regions 22 and the gate electrode layers 26' are partially exposed to the outside.

Thereafter, a metal layer 34 is formed over the perforated insulating interlayer 28, and is patterned such that a source metal electrode 34S is defined on each of the partially-exposed annular $N^+$-type source regions 22, and such that a gate metal electrode 34G is defined on each of the partially-exposed gate electrode layers 26'. Then, a metal layer 36 is formed as a drain electrode layer over the rear surface of the $N^+$-type semiconductor substrate 16, resulting in completion of the production of the vertical type power MOSFET devices on the $N^+$-type semiconductor substrate 16. Note, the layers 34 and 36 may be composed of a suitable metal material, such as aluminum.

Thereafter, the product is subjected to a dicing process such that the vertical type power MOSFET devices are individually separated from each other, and a separated device is used as the first or second semiconductor chip 12F or 12S. Of course, in the separated device, the respective source and gate metal electrodes 34S and 34G correspond to the source electrode pad (S1, S2) and the gate electrode pad (G1, G2), and the drain electrode layer 36 corresponds to a drain electrode layer (D1, D2).

Figure 9:
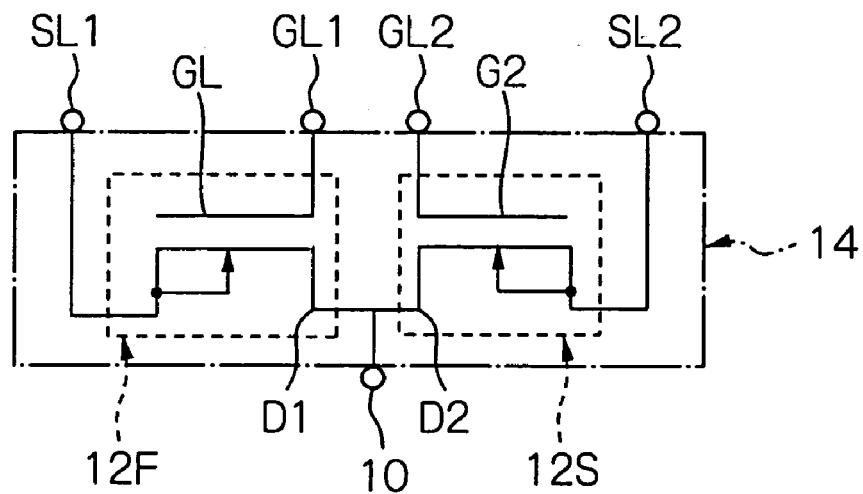
FIG. 9 is a wiring diagram of the first embodiment of the leadless type semiconductor package according to the present invention.

With reference to FIG. 9, a wiring diagram of the assembled leadless type of the semiconductor package according to the present invention is symbolically illustrated. Of course, in FIG. 9, the respective symbols corresponding to the elements shown in FIG. 7 are indicated by the same references 10, 12F, 12S, 14, D1, D2, G1, G2, GL1, GL2, SL1 and SL2.

Figure 10:
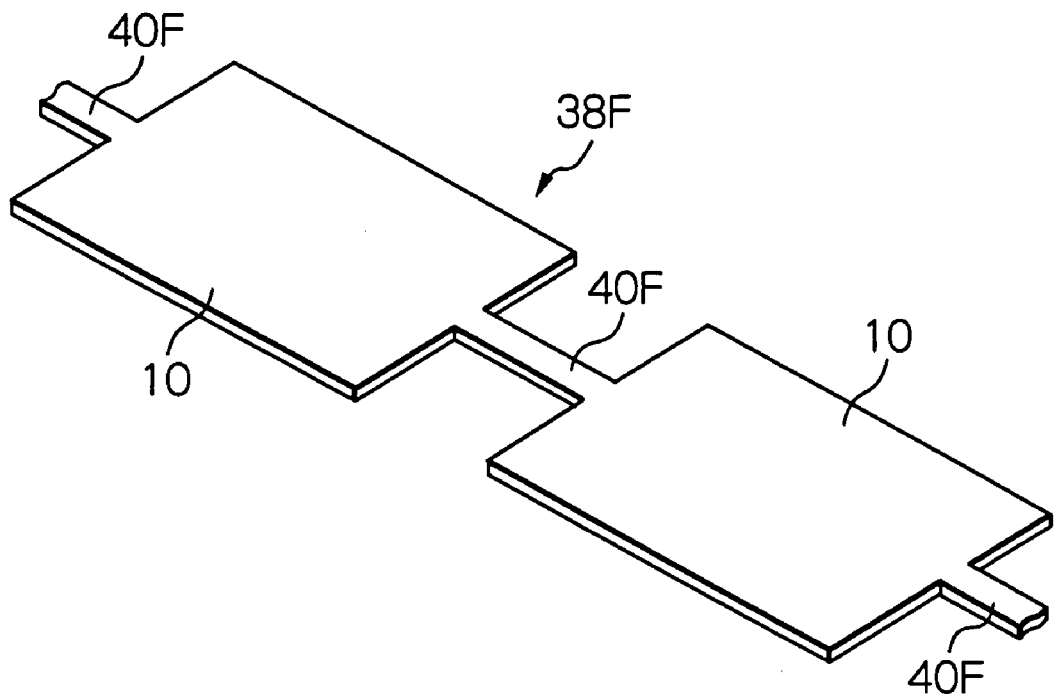
FIG. 10 is a perspective view of a first metal frame used in a first embodiment of a production process for manufacturing a plurality of leadless type semiconductor packages according to the present invention.

FIG. 10 shows a first metal frame, generally indicated by reference 38F, which is used in a first embodiment of a production process for manufacturing a plurality of leadless type semiconductor packages (FIGS. 5 to 7) according to the present invention.

The first metal frame 38F is formed of a suitable metal material, such as copper, brass or the like, and includes a plurality of rectangular metal plate-like mounts 10 which are integrally joined to each other by tie bar elements 40F. The first metal frame 38F may be punched and produced from a copper or brass plate blank by using a punching machine.

Figure 11:
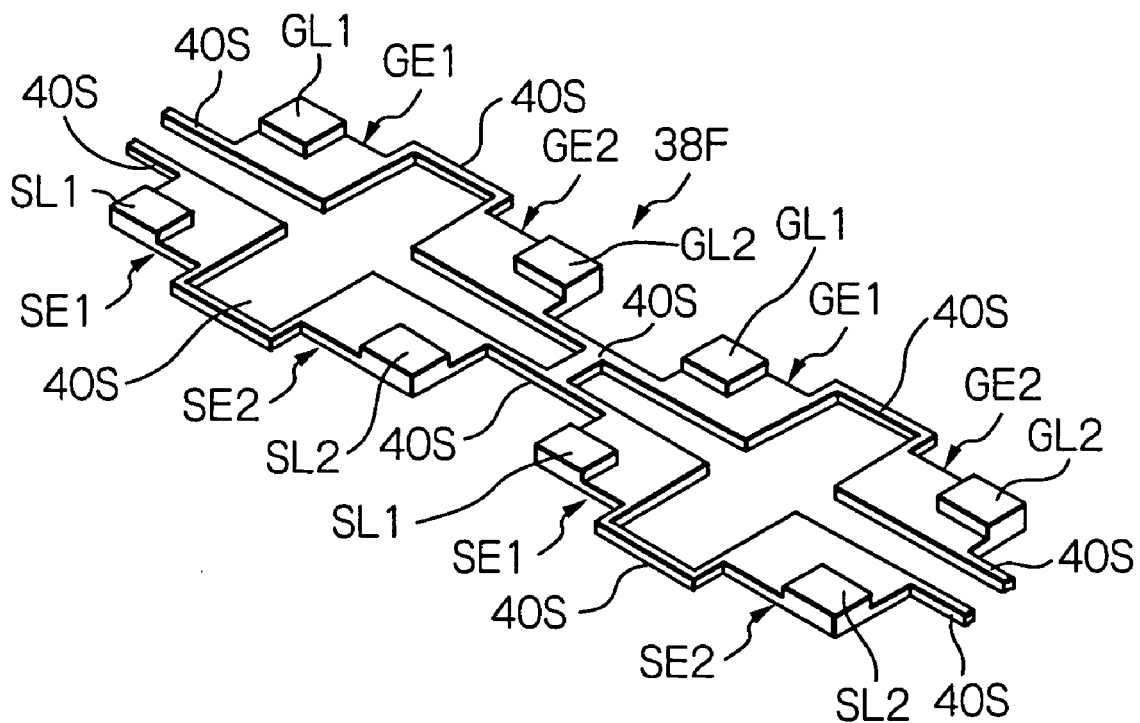
FIG. 11 is a perspective view of a second metal frame used in the first embodiment of the production process for manufacturing the plurality of the leadless type semiconductor packages according to the present invention.

FIG. 11 shows a second metal frame, generally indicated by reference 38S, which is used in the first embodiment of the production process for manufacturing the plurality of leadless type semiconductor packages (FIGS. 5 to 7) according to the present invention.

The second metal frame 38S is also formed of a suitable metal material, such as copper, brass or the like, and includes plural sets of four flat rectangular electrodes SE1, GE1, SE2, to and GE2 which are integrally joined to each other by tie bar elements 40S, and the respective flat electrodes SE1, GE1, SE2 and GE2 in each set have rectangular land portions SL1, GL1, SL2 and GL2.

Figure 12:
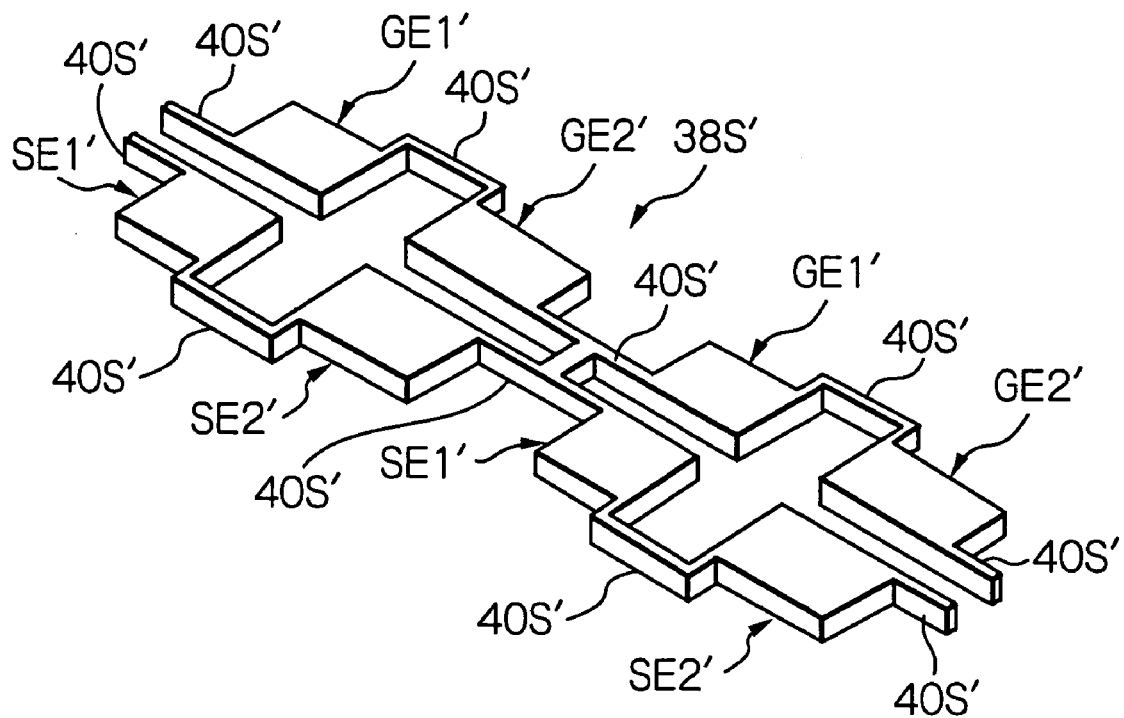
FIG. 12 is a perspective view of an intermediate product from which the second metal frame shown in FIG. 11 is produced.
Figure 13:
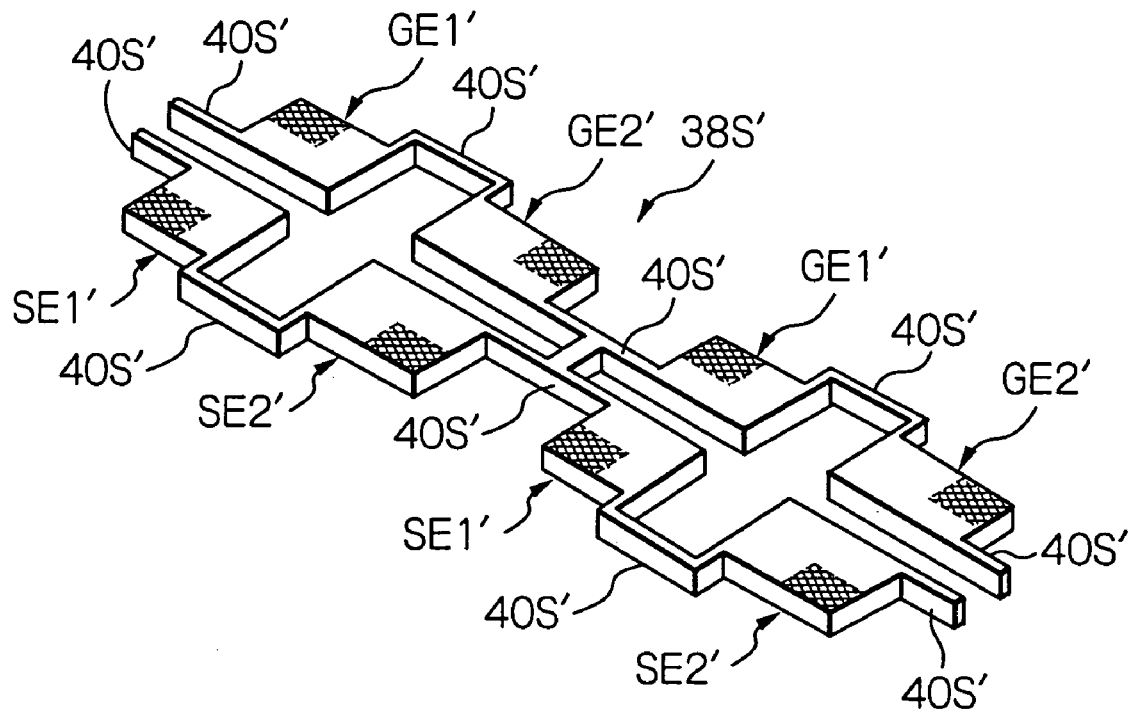
FIG. 13 is a perspective view, similar to FIG. 12, showing the intermediate product which is partially masked, using a photolithography process.

In order to produce the second metal frame 38S, first, as shown in FIG. 12, an intermediate product 38S' is prepared. The intermediate product 38S' may be punched and produced from a copper or brass plate blank by using a punching machine, and includes plural sets of four rectangular flat sections SE1', GE1', SE2' and GE2', which correspond to the respective rectangular flat electrodes SE1, GE1, SE2 and GE2, and which are integrally joined to each other by tie bar elements 40S'. Respective parts of the rectangular flat sections SE1', GE1', SE2' and GE2', corresponding to the rectangular land portions SL1, GL1, SL2 and GL2, are masked, using a photolithography process, as represented by cross-hatching areas in FIG. 13, and then the intermediate product 38S' is subjected to an etching process, so that the masked parts are left as the rectangular land portions SL1, GL1, SL2 and GL2 on the rectangular flat sections SE1', GE1', SE2' and GE2', respectively, resulting in the completion of production of the second metal frame 38S as shown in FIG. 11.

Next, with reference to FIGS. 14A to 14F, a first embodiment of the production process for manufacturing a plurality of leadless type semiconductor packages (FIGS. 5 to 7) according to the present invention is illustrated.

Figure 14A:
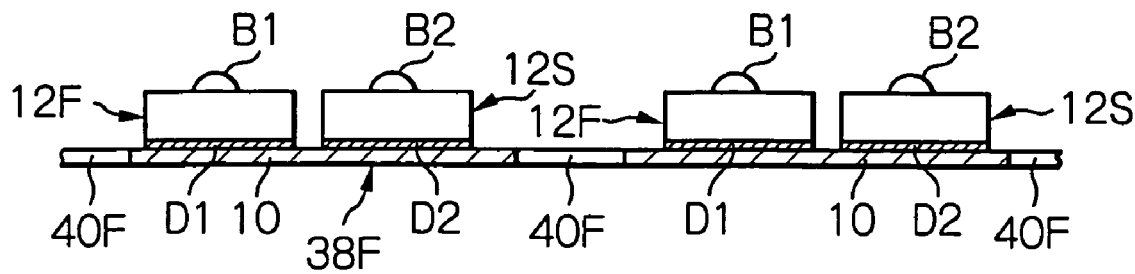
FIG. 14A is an explanatory view showing a first representative step of a first embodiment of the production process according to the present invention.

First, as shown in FIG. 14A, a first metal frame 38F (FIG. 10) is prepared, and plural sets of first and second semiconductor chips 12F and 12S are mounted on the respective rectangular metal plate-like mounts 10 included in the first metal frame 38F, and the drain electrode layers D1 and D2 of the first and second semiconductor chips 12F and 12S in each set are soldered to a corresponding plate-like mount 10, using a suitable solder paste, such as a silver paste.

Figure 14B:
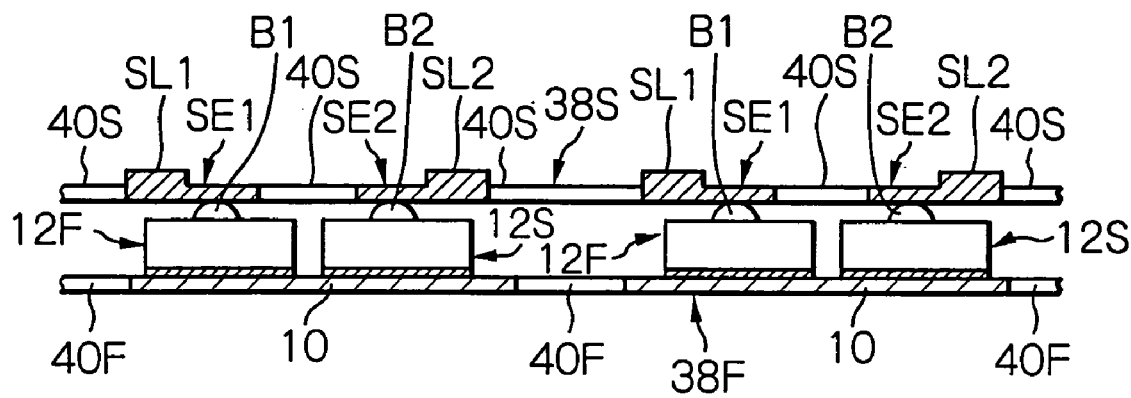
FIG. 14B is an explanatory view showing a second representative step of the first embodiment of the production process according to the present invention.

Then, as shown in FIG. 14B, a second metal frame 38S including plural sets of four rectangular flat electrodes SE1, GE1, SE2 and GE2 (FIG. 11) is prepared and applied to the plural sets of first and second semiconductor chips 12F and 12S, such that the respective flat electrodes SE1, GE1, SE2 and GE2 in each set are placed on and securely bonded to the four metal bumps B1 and B2 of the corresponding set of first and second semiconductor chips 12F and 12S, by using either an ultrasonic-pressure bonding method or a heat-pressure bonding method.

Figure 14C:
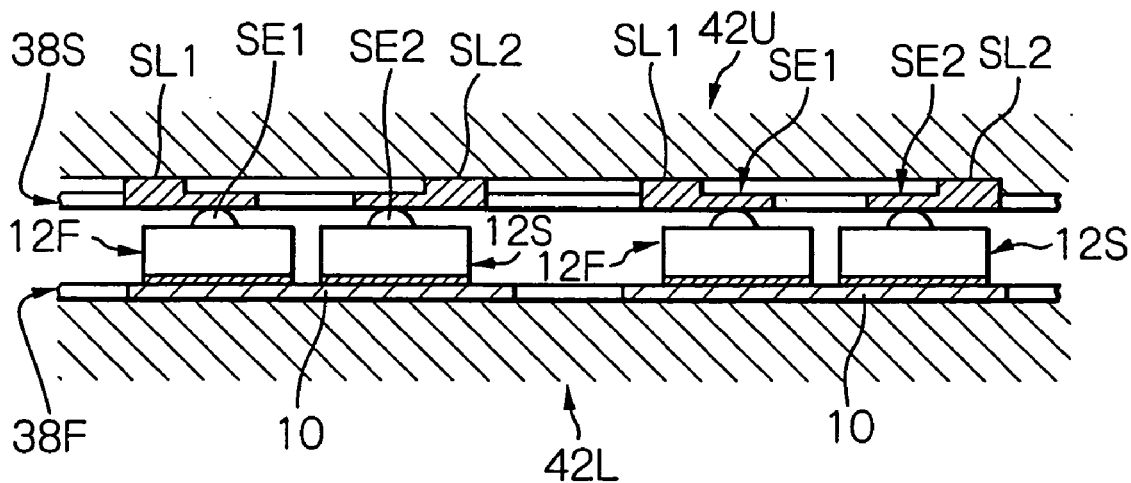
FIG. 14C is an explanatory view showing a third representative step of the first embodiment of the production process according to the present invention.
Figure 14D:
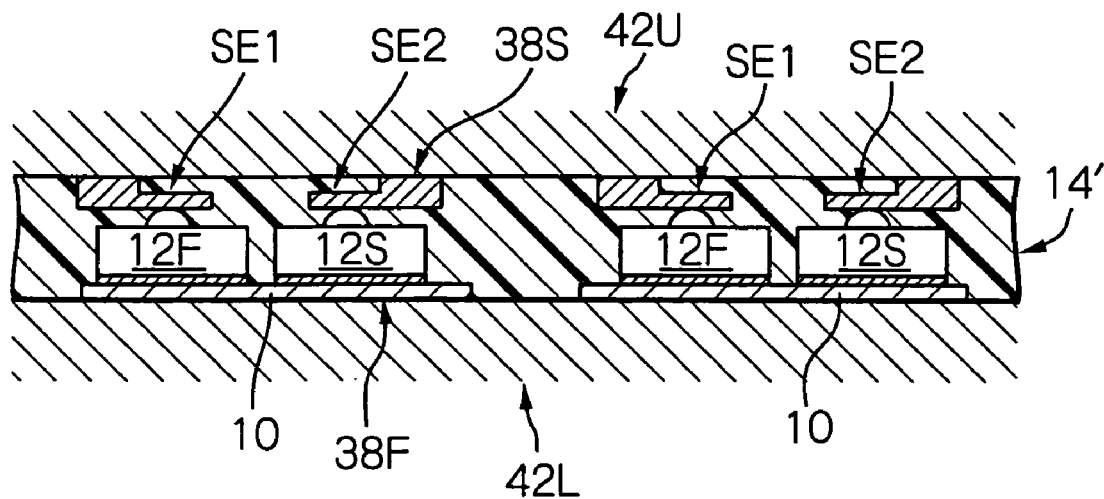
FIG. 14D is an explanatory view showing a fourth representative step of the first embodiment of the production process according to the present invention.

Thereafter, the intermediate product shown in FIG. 14B is received in a molding cavity defined by a pair of upper and lower mold dies 42U and 42L, as shown in FIG. 14C. Then, a suitable uncured resin material, such as epoxy, is introduced into the molding cavity defined by the upper and lower mold dies 42U and 42L, as shown in FIG. 14D, to thereby form a molded resin enveloper 14' sealing and encapsulating the plural sets of first and second semiconductor chips 12F and 12S and the plural sets of four flat electrodes SE1, GE1, SE2 and GE2.

Figure 14E:
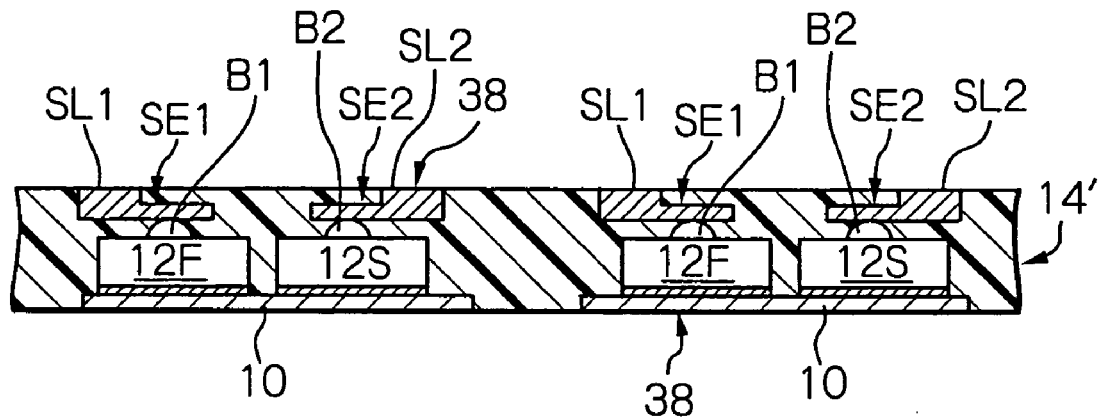
FIG. 14E is an explanatory view showing a fifth representative step of the first embodiment of the production process according to the present invention.

After the molded resin enveloper 14' is completely cured, the molded resin enveloper 14' is taken out of the upper and lower mold dies 42U and 42L, as shown in FIG. 14E. As is apparent from this drawing, the molding of the enveloper 14' is carried out so that the rectangular land portions SL1, GL1, SL2 and GL2 of the flat electrodes SE1, GE1, SE2 and GE2 are exposed on a top surface of the molded resin enveloper 14' and such that the rear surfaces of the plate-like mounts 10 are exposed on a bottom surface of the molded resin enveloper 14'.

Figure 14F:
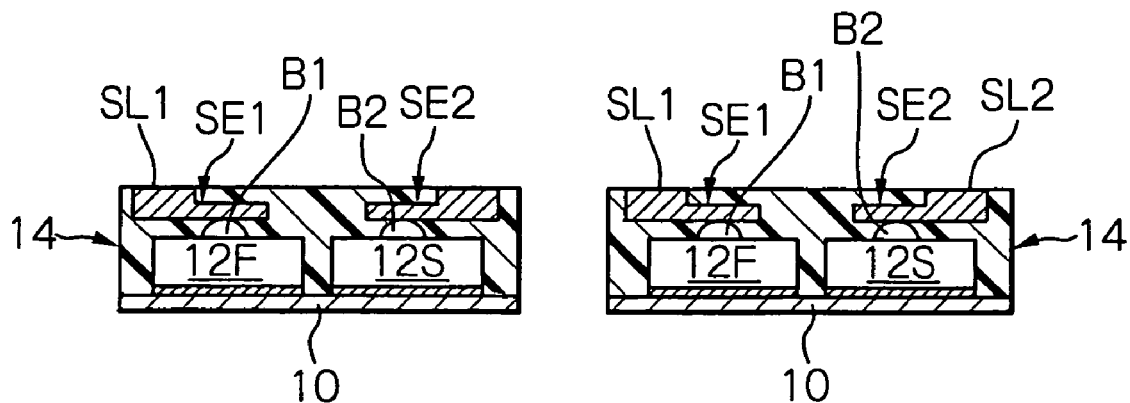
FIG. 14F is an explanatory view showing a sixth representative step of the first embodiment of the production process according to the present invention.

Thereafter, as shown in FIG. 14F, the molded resin enveloper 14' is cut and divided into a plurality of leadless type semiconductor packages, each of the packages including the plate-like mount 10, the first and second semiconductor chips 12F and 12S on the plate-like mount 10, the molded resin enveloper 14 sealing and encapsulating the first and second semiconductor chips 12F and 12S and the flat electrodes SE1, GE1, SE2 and GE2 associated therewith, as shown in FIGS. 5 to 7.

Figure 15A:
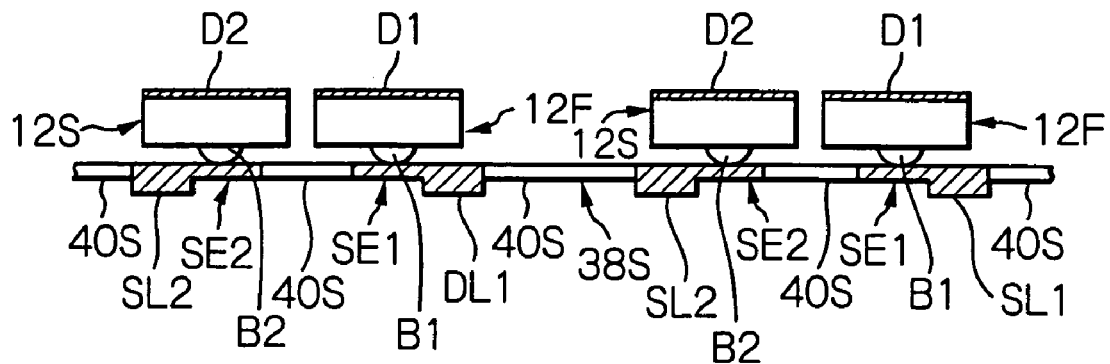
FIG. 15A is an explanatory view showing a first representative step of a modification of the aforesaid first embodiment of the production process according to the present invention.
Figure 15B:
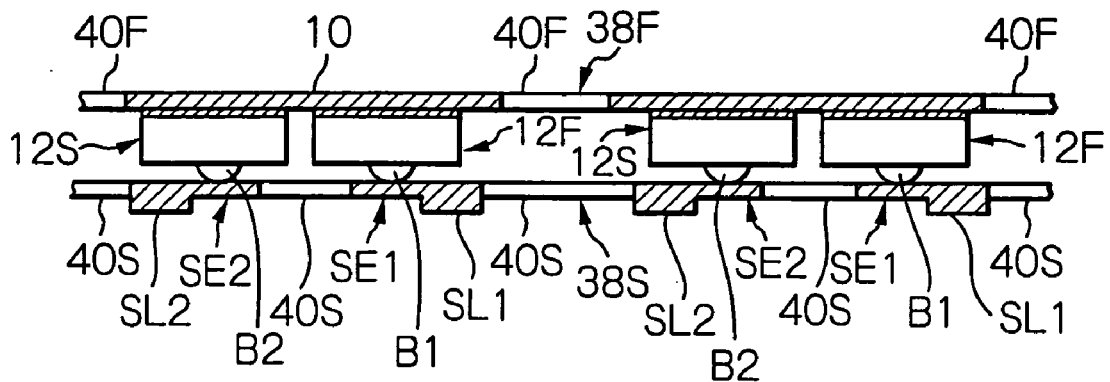
FIG. 15B is an explanatory view showing a second representative step of the modification of the aforesaid first embodiment of the production process according to the present invention.

With respect to FIGS. 15A and 15B, a modification of the first embodiment of the production process according to the present invention is illustrated.

In this modified embodiment, first, as shown in FIG. 15A, a second metal frame 38S including plural sets of four rectangular flat electrodes SE1, GE1, SE2 and GE2 (FIG. 11) is prepared, and plural sets of first and second semiconductor chips 12F and 12S are applied to the second metal frame 38S such that the respective metal bumps B1 and B2 of each set of first and second semiconductor chips 12F and 12S are placed on and securely bonded to a corresponding set of flat electrodes SE1, GE1, SE2 and GE2, by using either an ultrasonic-pressure bonding method or a heat-pressure bonding method.

Then, as shown in FIG. 15B, a first metal frame 38F is prepared and applied to the plural sets of first and second semiconductor chips 12F and 12S, such that each of the plate-like mounts 10 included in the first metal frame 38F is securely soldered to the drain electrodes D1 and D2 of a corresponding set of first and second semiconductor chips 12F and 12S, using a suitable solder paste, such as a silver paste.

The intermediate product as shown in FIG. 15B is substantially identical to that shown in FIG. 14B, and is processed in substantially the same manner as shown in FIGS. 14C to 14F, to thereby produce a plurality of leadless type semiconductor packages (FIGS. 5 to 7).

In the above-mentioned first embodiment of the leadless type semiconductor package, although the plate-like mount or common drain electrode 10 is exposed to the outside, it may be completely buried in the molded resin enveloper 14 when it is unnecessary to connect the common drain electrode 10 to an electrode pad provided on a wiring board on which the leadless type semiconductor package be mounted.

Figure 16:
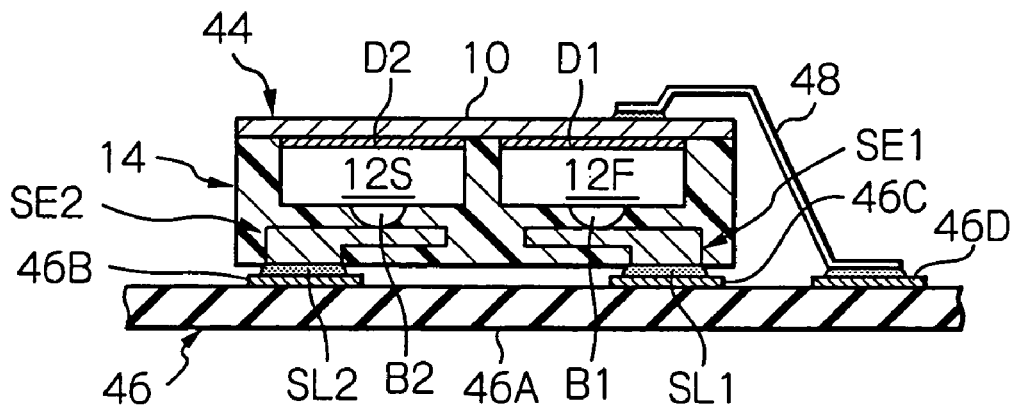
FIG. 16 is a cross-sectional view showing a first mounting-arrangement in which the first embodiment of the leadless type package according to the present invention is mounted on a wiring board.

FIG. 16 shows a first mounting-arrangement in which the aforesaid leadless type package according to the present invention is mounted on a wiring board.

In FIG. 16, the leadless type semiconductor package and the wiring board are generally indicated by references 44 and 46, respectively. The wiring board 46 comprises an insulating plate-like member 46A on which a wiring pattern is formed, using a photolithography process and an etching process. The insulating plate-like member 46A may be made from a rigid plate composed of a suitable synthetic resin material, and otherwise may be made from a flexible film composed of a suitable synthetic resin material.

The wiring pattern includes a set of four electrode pads, only two of which are indicated by references 46B and 46C, with the four electrode pads being arranged in substantially the same manner as the exposed land portions or electrode pads SL1, GL1, SL2 and GL2 of the leadless type semiconductor package 44. The wiring pattern also includes an additional electrode pad indicated by reference 46D. Note, of course, the insulating plate-like member 46 may include another wiring pattern having various electrode pads, if necessary.

The leadless type semiconductor package 44 is mounted on the wiring board 46 such that the exposed land portions or electrode pads SL1, GL1, SL2 and GL2 of the leadless type semiconductor package 44 are soldered to the set of four electrode pads (46B, 46C), using a suitable solder paste, such as a silver paste. Also, the plate-like mount or common drain electrode 10 are electrically connected to the additional electrode pad 46d through the intermediary of a shaped metal lead 48. Namely, the respective ends the shaped metal lead 48 are soldered to the common drain electrode 10 and the additional electrode pads 46D, using a suitable solder paste, such as a silver paste.

The aforesaid first mounting-arrangement is advantageous in that the mounting of the leadless type semiconductor package 44 on the wiring board 46 can be achieved, using a conventional face-down mounting process and a conventional metal-lead soldering process. Namely, it is unnecessary to develop new mounting processes for the leadless type semiconductor package according to the present invention.

Figure 17:
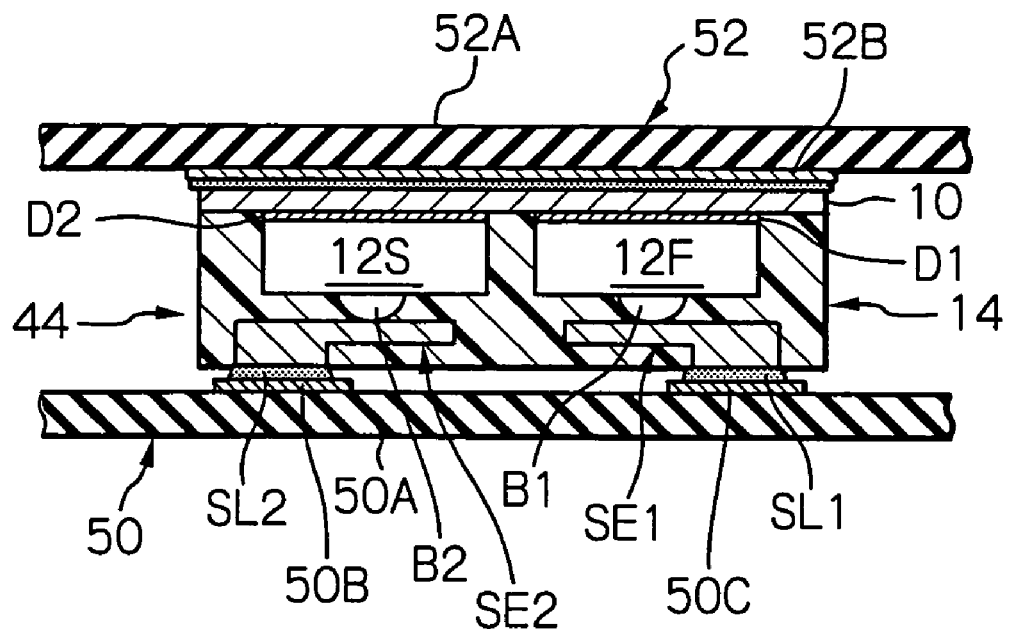
FIG. 17 is a cross-sectional view showing a second mounting-arrangement in which the first embodiment of the leadless type package according to the present invention is associated with two wiring boards.

FIG. 17 shows a second mounting-arrangement in which the aforesaid leadless type package according to the present invention is associated with two wiring boards, that is, first and second wiring boards.

In FIG. 17, the leadless type semiconductor package is indicated by reference 44, and the respective first and second wiring boards are generally indicated by references 50 and 52. The first wiring board 50 comprises an insulating plate-like member 50A on which a wiring pattern is formed, using a photolithography process and an etching process. Similarly, the second wiring board 52 comprises an insulating plate-like member 52A on which a wiring pattern is formed, using a photolithography process and an etching process. Each of the insulating plate-like members 50A and 52A may be made from a rigid plate composed of a suitable synthetic resin material, and otherwise may be made from a flexible film composed of a suitable synthetic resin material.

The wiring pattern of the insulating plate-like member 50A includes a set of four electrode pads, only two of which are indicated by references 50B and 50C, with the four electrode pads being arranged in substantially the same manner as the exposed land portions or electrode pads SL1, GL1, SL2 and GL2 of the leadless type semiconductor package 44. On the other hand, the wiring pattern of the insulating plate-like member 52A includes a rectangular electrode pad 52B corresponding to the common drain electrode 10 of the leadless type semiconductor package 44.

Similar to the first mounting-arrangement shown in FIG. 16, the leadless type semiconductor package 44 is mounted on the first wiring board 50 such that the exposed land portions or electrode pads SL1, GL1, SL2 and GL2 of the leadless type semiconductor package 44 are soldered to the set of four electrode pads (50B, 50C), using a suitable solder paste, such as a silver paste. Then, the second wiring board 52 is applied to the leadless type semiconductor package 44 mounted on the first wiring board 52, and the rectangular electrode pad 52B of the second wiring board 52 is soldered to the common drain electrode 10 of the leadless type semiconductor package 44, using a suitable solder paste, such as a silver paste.

The aforesaid second mounting-arrangement is also advantageous in that the mounting of the leadless type semiconductor package 44 on the first wiring board 50 can be achieved, using a conventional face-down mounting process.

In the aforesaid second mounting-arrangement shown in FIG. 17, if the insulating plate-like members 50A and 52A are made from the flexible film, both the first and second wiring boards 50 and 52 can be constituted as a single flexible film-like wiring board. In this case, the set of four electrode pads (50B, 50C) and the rectangular electrode pad 52B are arranged on the single flexible film-like wiring board so as to be remotely separated from each other, such that the rectangular electrode pad 52 can be accessed and soldered to the common drain electrode 10 by folding the single flexible film-like wiring board on which the leadless type semiconductor package 44 are previously mounted.

Figure 18:
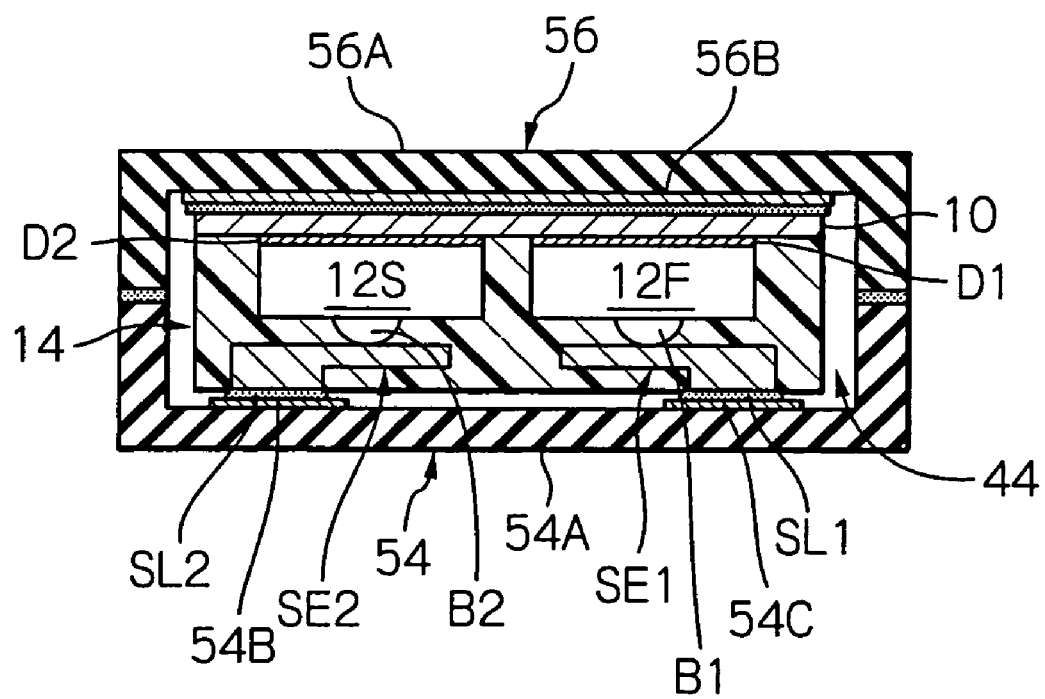
FIG. 18 is a cross-sectional view showing a third mounting-arrangement in which the first embodiment of the leadless type package according to the present invention is associated with two rectangular tray-like wiring boards.

FIG. 18 shows a third mounting-arrangement in which the aforesaid leadless type package according to the present invention is associated with two tray-like wiring boards, that is, first and second tray-like wiring boards.

In FIG. 18, the leadless type semiconductor package is indicated by reference 44, and the respective first and second tray-like wiring boards are generally indicated by references 54 and 56. The first tray-like wiring board 54 comprises a rectangular insulating tray-like member 54A on an inner bottom surface of which a wiring pattern is formed, using a photolithography process and an etching process. Similarly, the second tray-like wiring board 56 comprises a rectangular insulating tray-like member 56A on which a wiring pattern is formed, using a photolithography process and an etching process. Each of the insulating tray-like members 54A and 56A is formed as a rigid member, and may be molded from a suitable synthetic resin material.

Note, as is apparent from FIG. 18, the first tray-like board 54 has substantially the same configuration as the second tray-like board 56.

The wiring pattern of the insulating tray-like member 54A includes a set of four electrode pads, only two of which are indicated by references 54B and 54C, with the four electrode pads being arranged in substantially the same manner as the exposed land portions or electrode pads SL1, GL1, SL2 and GL2 of the leadless type semiconductor package 44. On the other hand, the wiring pattern of the insulating tray-like member 56A includes a rectangular electrode pad 56B corresponding to the common drain electrode 10 of the leadless type semiconductor package 44.

Similar to the first and second mounting-arrangement shown in FIGS. 16 and 17, the leadless type semiconductor package 44 is mounted on the inner bottom surface of the first tray-like wiring board 54 such that the exposed land portions or electrode pads SL1, GL1, SL2 and GL2 of the leadless type semiconductor package 44 are soldered to the set of four electrode pads (54B, 54C), using a suitable solder paste, such as a silver paste. Then, while the first tray-like wiring board 54 is covered with and adhered to the second tray-like wiring board 56, using a suitable adhesion agent, the rectangular electrode pad 54B of the second tray-like wiring board 56 is soldered to the drain electrode 10 of the leadless type semiconductor package 44, using a suitable solder paste, such as a silver paste.

The aforesaid third mounting-arrangement is also advantageous in that the mounting of the leadless type semiconductor package 44 on the first tray-like wiring board 54 can be achieved, using a conventional face-down mounting process. Also, according to the third mounting-arrangement, since the leadless type semiconductor package 44 is enclosed and sealed in the first and second tray-like wiring boards 54 and 56, it is possible to effectively protect the leadless type semiconductor package 44 from external negative environmental influences.

Figure 19:
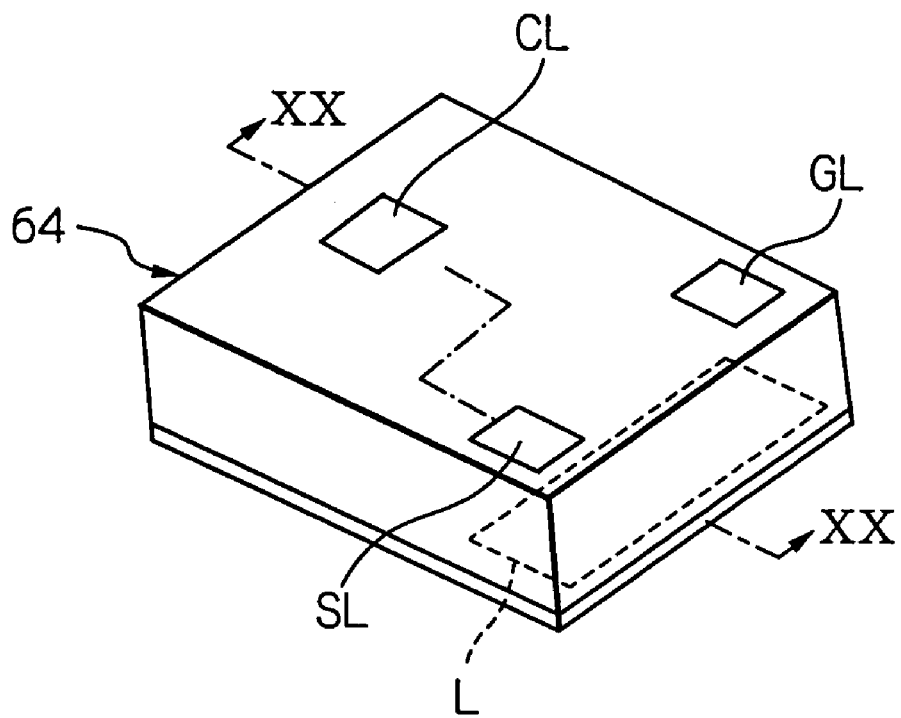
FIG. 19 is a perspective view of a second embodiment of the leadless type semiconductor package according to the present invention.
Figure 20:
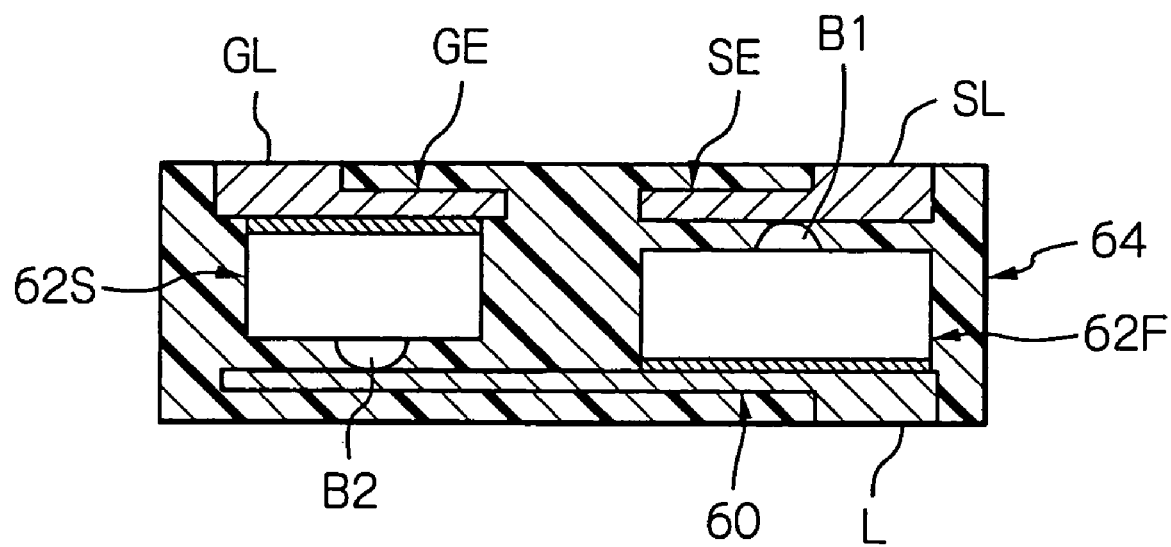
FIG. 20 is a cross-sectional view taken along the XX—XX line of FIG. 19.
Figure 21:
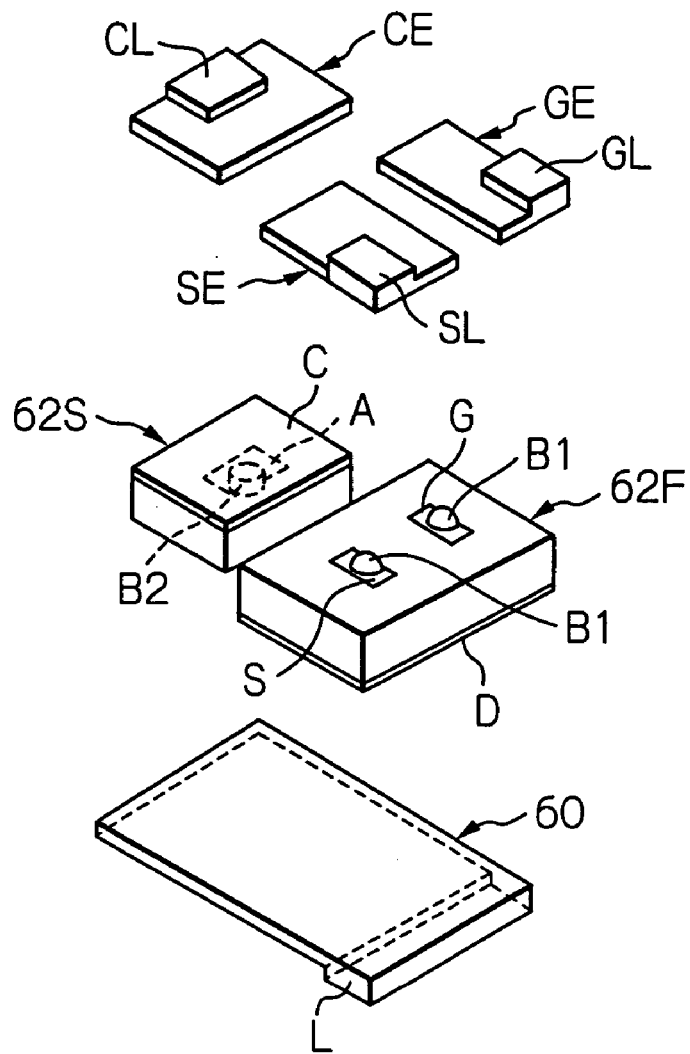
FIG. 21 is an exploded view of elements forming the leadless type semiconductor package shown in FIGS. 19 and 20.

With reference to FIGS. 19, 20 and 21, a second embodiment of the leadless type semiconductor package according to the present invention is illustrated.

As is apparent from FIGS. 20 and 21, in the second embodiment, the leadless type semiconductor package includes a rectangular metal plate-like mount 60, and first and second semiconductor chips 62F and 62S securely mounted on the plate-like mount 60. As best shown in FIG. 21, the plate-like mount 60 has a rectangular land portion L provided along one side thereof, and may be formed of a suitable metal material, such as copper, brass or the like. In this second embodiment, the first semiconductor chip 62F is formed as a vertical type power MOSFET device, which is substantially identical with the power MOSFET (12F, 12S) used in the aforesaid first embodiment, and the second semiconductor chip 62S is formed as a suitable diode device.

As best shown in FIG. 21, the first semiconductor chip 62F has a drain electrode layer D formed over on a bottom surface thereof, and both source and gate electrode pads S and G formed on a top surface of the first semiconductor chip 62F. The drain electrode layer D and the electrode pads S and G may be formed of a suitable metal material, such as aluminum. For example, the drain electrode layers D1 and D2 are soldered to the plate-like mount 60, using a suitable solder paste, such as a silver paste. A metal bump B1, which is preferably formed of gold, is provided on and bonded to each of the electrode pads S and G by using either an ultrasonic-pressure bonding method or a heat-pressure bonding method. Note, each of the metal bumps B1 may be replaced with a solder ball, if necessary.

The second semiconductor chip 62S has a cathode electrode layer C provided on a bottom surface of thereof, and an anode electrode pad A formed on a top surface of the second semiconductor chip 62S. A metal bump B2, which is preferably formed of gold, is provided on and bonded to the anode electrode pad A by using either an ultrasonic-pressure bonding method or a heat-pressure bonding method. Note, a solder ball may be substituted for the metal bump B2, if necessary. As is apparent from FIGS. 20 and 21, in this second embodiment, the second semiconductor chip 62S is flipped over such that the bump B2 is bonded to the plate-like mount 60 by using either an ultrasonic-pressure bonding method or a heat-pressure bonding method.

As best shown in FIG. 21, respective rectangular flat source and gate electrodes SE and GE, which are formed of a suitable metal material, such as copper, brass or the like, are provided on and bonded to the metal bumps B1 on the source and gate electrode pads S and G of the first semiconductor chip 62F, by using either an ultrasonic-pressure bonding method or a heat-pressure bonding method. The flat source electrode SE has a rectangular land portion SL provided at one corner thereof, and the flat gate electrode GE has a rectangular land portion GL provided at one corner thereof.

On the other hand, a rectangular flat cathode electrode CE, which is formed of a suitable metal material, such as copper, brass or the like, is provided on and soldered to the cathode electrode layer C of the second semiconductor chip 62S, using a suitable solder paste, such as a silver solder. The flat cathode electrode CE has a rectangular land portion provided along a central part of a side thereof.

As shown in FIGS. 19 and 20, the leadless type semiconductor package further includes a molded resin enveloper 64 sealing and encapsulating the plate-like mount 60, the first and second semiconductor chips 62F and 62S, and the flat electrodes SE, GE and CE, such that the rectangular land portion L is exposed on a bottom surface of the molded resin enveloper 64, and the rectangular land portions SL, GL and CL are exposed on a top surface of the molded resin enveloper 64. The respective exposed land portions SL and GL serve as an outer source electrode pad and an outer gate electrode pad for the first semiconductor chip 62F, and the exposed land portion CL serves as an outer cathode electrode pad for the second semiconductor chip 62S. Also, the exposed land portion L serves as not only an drain electrode pad for the first semiconductor chip 62F but also as an anode electrode pad for the second semiconductor chip 72S.

As is apparent from FIGS. 6 and 7, the flat electrodes SE, GE and CE can be more compactly provided and arranged above the first and second semiconductor chips 62F and 62S in comparison with the conventional leadless semiconductor packages (FIGS. 1 to 4), and thus it is possible to considerably reduce a thickness of the molded resin enveloper 64, and therefore, an entire thickness of the leadless type semiconductor package according to the present invention can be reduced.

Figure 22:
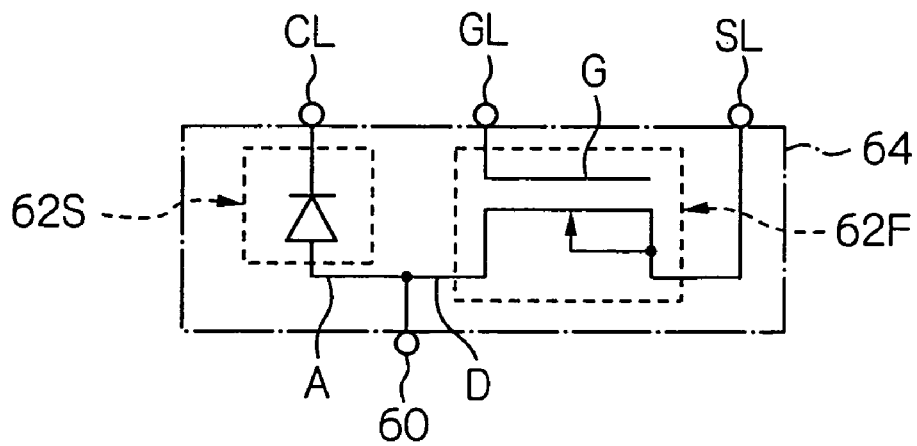
FIG. 22 is a wiring diagram of the second embodiment of the leadless type semiconductor package according to the present invention.

With reference to FIG. 22, a wiring diagram of the second embodiment of the leadless type of the semiconductor package according to the present invention is symbolically illustrated. Of course, in FIG. 22, the respective symbols corresponding to the elements shown in FIG. 20 are indicated by the same references 60, 62F, 62S, 64, A, D, G, CL, GL and SL.

Similar to the aforesaid first embodiment of the leadless type semiconductor package, the second embodiment of the leadless type semiconductor package may be associated with at least one rigid or flexible wiring board, as explained with reference to FIGS. 16 and 17. Further, the second embodiment of the leadless type semiconductor package may be associated with two tray-like wiring boards, as explained with reference to FIG. 18.

Figure 23:
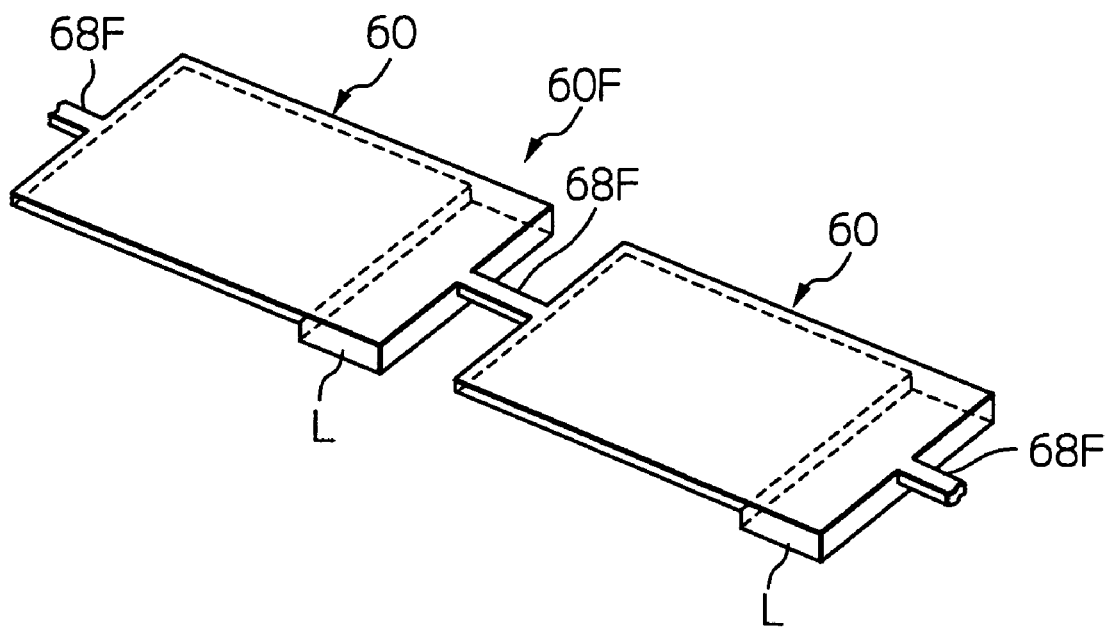
FIG. 23 is a perspective view of a first metal frame used in a second embodiment of a production process for manufacturing a plurality of leadless type semiconductor packages according to the present invention.

FIG. 23 shows a first metal frame, generally indicated by reference 66F, which is used in a second embodiment of a production process for manufacturing a plurality of leadless type semiconductor packages (FIGS. 19 to 21) according to the present invention.

The first metal frame 66F is formed of a suitable metal material, such as copper, brass or the like, and includes a plurality of rectangular metal plate-like mounts 60 which are integrally joined to each other by tie bar elements 68F.

Figure 24:
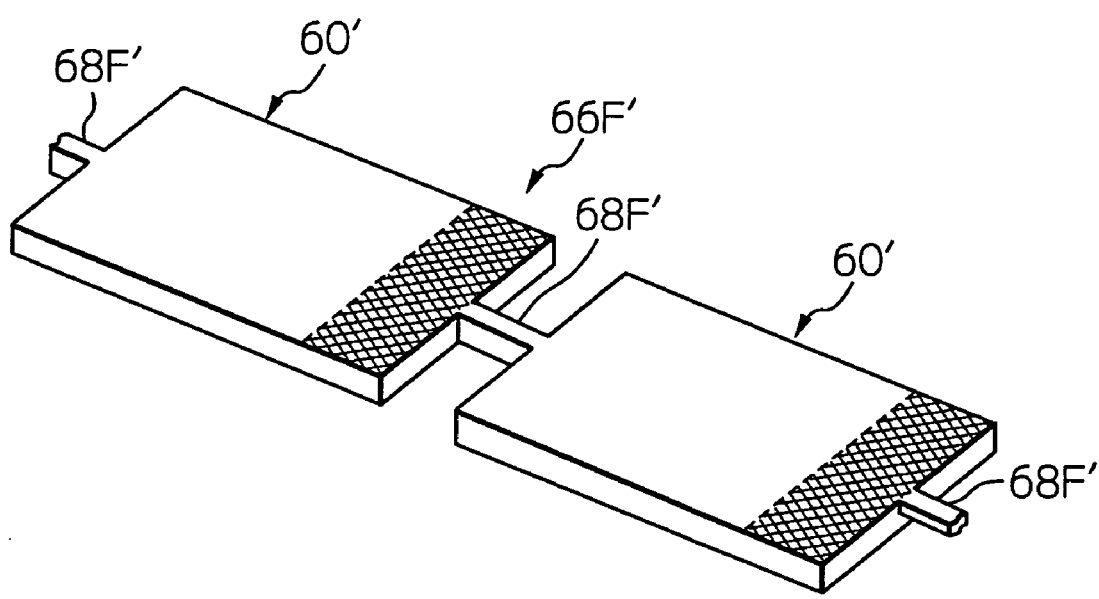
FIG. 24 is a perspective view of an intermediate product from which the first metal frame shown in FIG. 23 is produced.

In order to produce the first metal frame 66F, first, as shown in FIG. 24, an intermediate product 66F' is prepared. The intermediate product 66F' may be punched and produced from a copper or brass plate blank by using a punching machine, and includes a plurality of rectangular plate-like sections 60' which correspond to the plate-like mounts 60, and which are integrally joined to each other by tie bar elements 68F' Respective parts of the rectangular plate-like sections 60' corresponding to the rectangular land portions L are masked, using a photolithography process, as represented by cross-hatching areas in FIG. 24, and then the intermediate product 66F' is subjected to an etching process, so that the masked parts are left as the rectangular land portion L on the rectangular plate-like sections 60', respectively, resulting in the completion the production of the second metal frame 66F as shown in FIG. 23.

Figure 25:
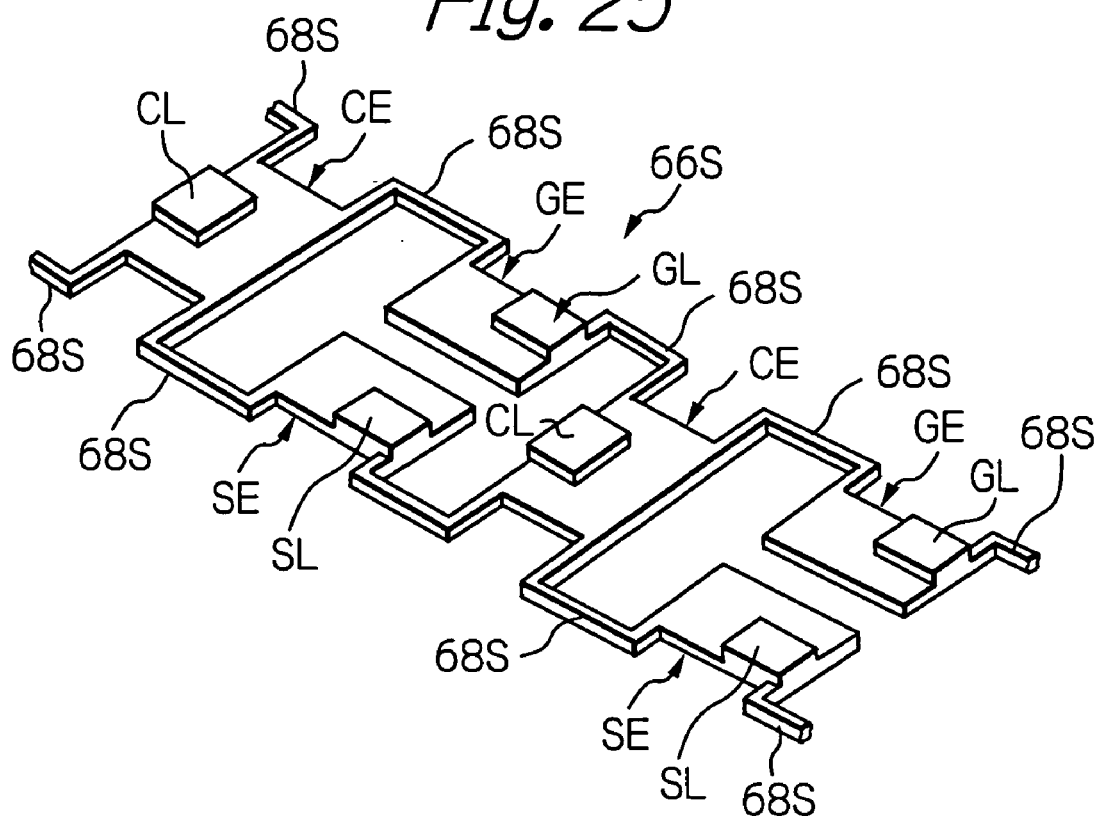
FIG. 25 is a perspective view of a second metal frame used in the second embodiment of the production process for manufacturing the plurality of the leadless type semiconductor packages according to the present invention.

FIG. 25 shows a second metal frame, generally indicated by reference 66S, which is used in the second embodiment of the production process for manufacturing the plurality of leadless type semiconductor packages (FIGS. 19 to 21) according to the present invention.

The second metal frame 66S is also formed of a suitable metal material, such as copper, brass or the like, and includes plural sets of three rectangular flat electrodes SE, GE and CE which are integrally joined to each other by tie bar elements 68S, and the respective flat electrodes SE, GE and CE in each set have rectangular land portions SL, GL and CL.

Figure 26:
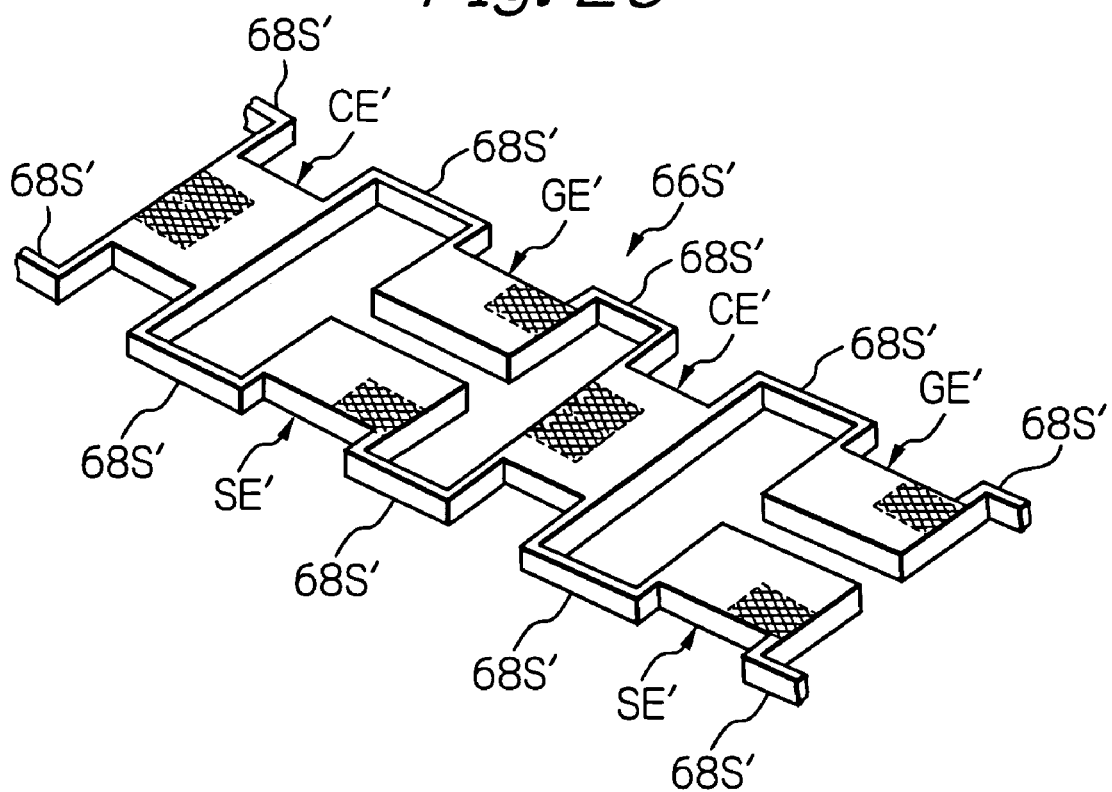
FIG. 26 is a perspective view of an intermediate product from which the second metal frame shown in FIG. 25 is produced.

In order to produce the second metal frame 66S, first, as shown in FIG. 26, an intermediate product 66S' is prepared. The intermediate product 66S' may be punched and produced from a copper or brass plate blank by using a punching machine, and includes plural sets of three rectangular flat sections SE', GE' and CE', which correspond to the respective rectangular flat electrodes SE, GE and CE, and which are integrally joined to each other by tie bar elements 68S' Respective parts of the rectangular flat sections SE', GE' and CE', corresponding to the rectangular land portions SL, GL and CL, are masked, using a photolithography process, as represented by cross-hatching areas in FIG. 26, and then the intermediate product 66S' is subjected to an etching process, so that the masked parts are left as the rectangular land portions SL, GL and CL on the rectangular flat sections SE' GE' and CE', respectively, resulting in the completion the production of the second metal frame 66S as shown in FIG. 25.

Next, with reference to FIGS. 27A to 27G, a second embodiment of the production process for manufacturing a plurality of leadless type semiconductor packages (FIGS. 19 to 21) according to the present invention is illustrated.

Figure 27A:
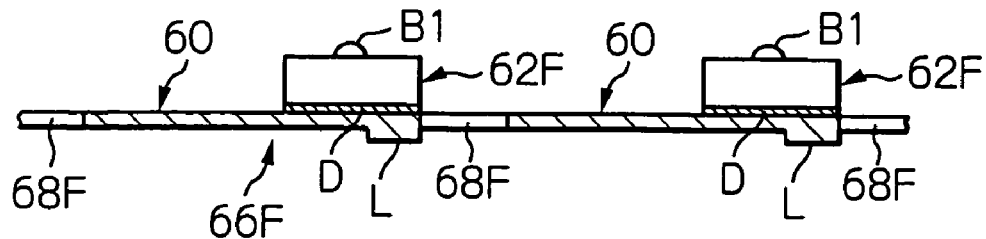
FIG. 27A is an explanatory view showing a first representative step of a second embodiment of the production process according to the present invention.

First, as shown in FIG. 27A, a first metal frame 66F (FIG. 23) is prepared, and a plurality of first semiconductor chips 62F are mounted on the respective rectangular metal plate-like mounts 60 included in the first metal frame 66F, such that the drain electrode layer D1 of each first semiconductor chip 62F is soldered to a corresponding plate-like mount 60, using a suitable solder paste, such as a silver paste.

Figure 27B:
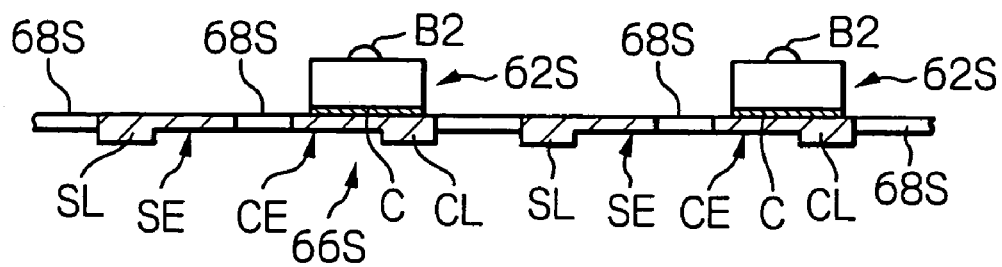
FIG. 27B is an explanatory view showing a second representative step of the second embodiment of the production process according to the present invention.

Then, as shown in FIG. 27B, a second metal frame 66S (FIG. 25) is prepared, and a plurality of second semiconductor chips 62S are mounted on the respective rectangular flat cathode electrodes CE included in the second metal frame 66S, such that the cathode electrode layer C of each of the second semiconductor chips 62S is soldered to a corresponding flat cathode electrode CE, using a suitable solder paste, such as a silver paste.

Figure 27C:
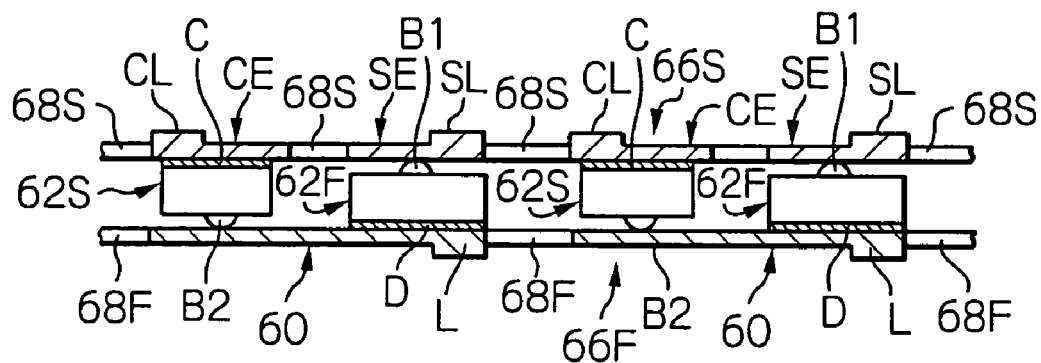
FIG. 27C is an explanatory view showing a third representative step of the second embodiment of the production process according to the present invention.

Subsequently, the second metal frame 66S carrying the second semiconductor chips 66S is applied to the first metal frame 66F on which the first semiconductor chips 62F are mounted, such that the respective metal bumps B1 of each of the first semiconductor chips 62F are bonded to the flat source and gate electrodes SE and GE in a corresponding set, and such that the metal bump 2 of each of the second semiconductor chips 62S is bonded to a corresponding plate-like mount 60, as shown in FIG. 27C.

Figure 27D:
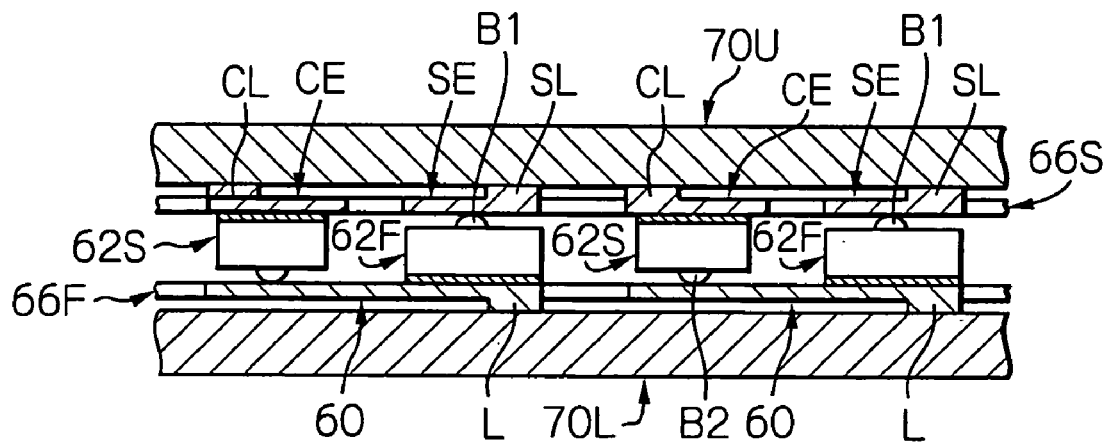
FIG. 27D is an explanatory view showing a fourth representative step of the second embodiment of the production process according to the present invention.
Figure 27E:
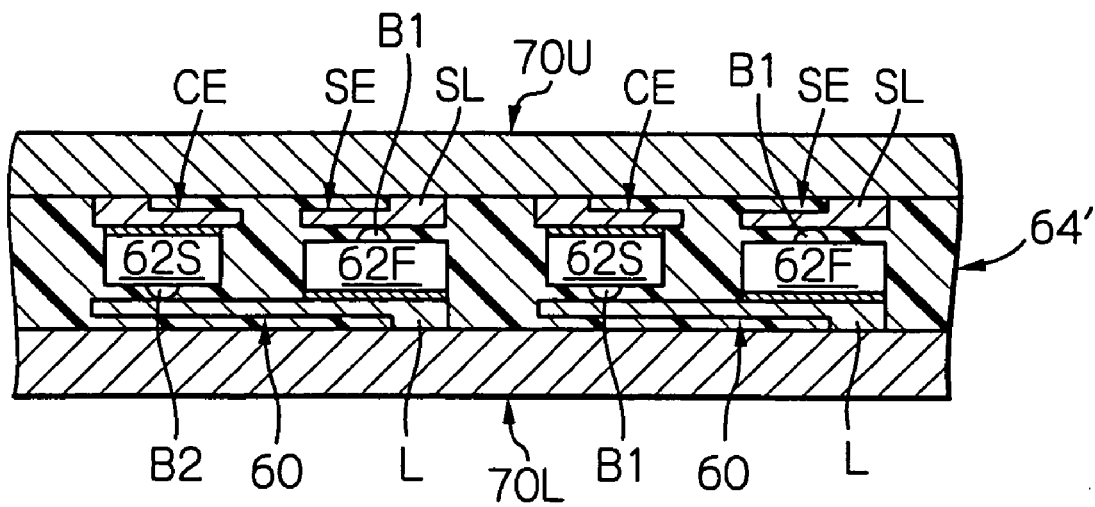
FIG. 27E is an explanatory view showing a fifth representative step of the second embodiment of the production process according to the present invention.

Thereafter, the intermediate product shown in FIG. 27C is received in a molding cavity defined by a pair of upper and lower mold dies 70U and 70L, as shown in FIG. 27D. Then, a suitable uncured resin material, such as epoxy, is introduced into the molding cavity defined by the upper and lower mold dies 70U and 70L, as shown in FIG. 24E, to thereby form a molded resin enveloper 64' sealing and encapsulating the plurality of rectangular plate-like mounts 60, the plural sets of first and second semiconductor chips 62F and 62S, and the plural sets of flat electrodes SE, GE and CE.

Figure 27F:
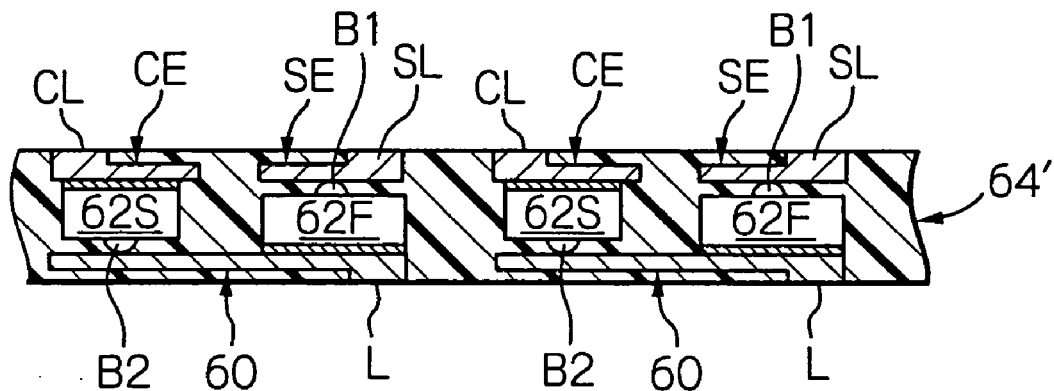
FIG. 27F is an explanatory view showing a sixth representative step of the second embodiment of the production process according to the present invention.

After the molded resin enveloper 64' is completely cured, the molded resin enveloper 64' is taken out of the upper and lower mold dies 70U and 70L, as shown in FIG. 27F. As is apparent from this drawing, the molding of the enveloper 64' is carried out so that the rectangular land portions SL, GL and CL of the flat electrodes SE, GE and CE are exposed on a top surface of the molded resin enveloper 14', and such that the land portions L of the plate-like mounts 60 are exposed on a bottom surface of the molded resin enveloper 64'.

Figure 27G:
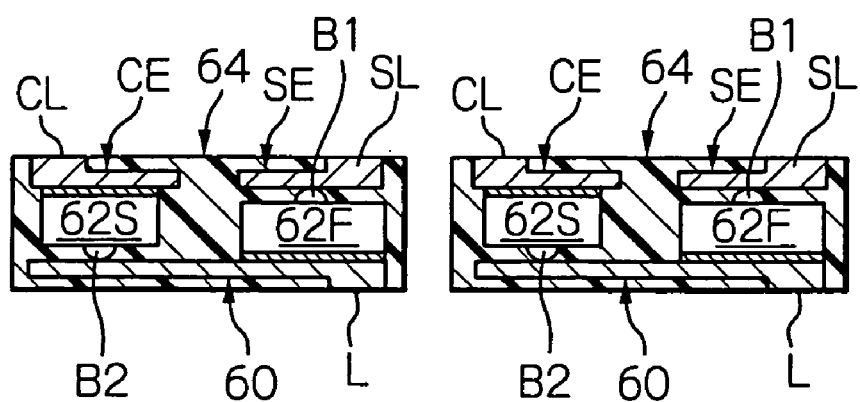
FIG. 27G is an explanatory view showing a seventh representative step of the second embodiment of the production process according to the present invention.

Thereafter, as shown in FIG. 27G, the molded resin enveloper 64' is cut and divided into a plurality of leadless type semiconductor packages, each of the packages including the plate-like mount 60, the first and second semiconductor chips 62F and 62S on the plate-like mount 60, the molded resin enveloper 14 sealing and encapsulating the first and second semiconductor chips 62F and 62S and the flat electrodes SE, GE and CE associated therewith, as shown in FIGS. 19 to 21.

In the above-mentioned first and second embodiment of the leadless type semiconductor packages, although a metal bump (B1, B2) is bonded to an electrode pad (S1, G1, S2, G2, S, G, A) formed on a semiconductor chip (12F, 12S, 62F, 62S), it may be previously bonded to either a flat electrode (SE1, GE1, SE2, GE2, SE, GE) or a plate-like mount (60). Further, although it is preferable to establish an electrical connection between the electrode pad (S1, G1, S2, G2, S, G, A) and either the flat electrode (SE1, GE1, SE2, GE2, SE, GE) or the plate-like mount (60), using the metal bump or solder ball, the electrical connection therebetween may be established with another conductive element or material as long as a thickness of the semiconductor chip (12F, 12S, 62F, 62S) is not extremely increased.

Also, in the first and second embodiments of the leadless type semiconductor package, although a mold resin enveloper (14, 64) encapsulates two semiconductor chips (12F, 12S; 62F, 62s), only one semiconductor chip may be included in the mold resin enveloper (14, 64). Also, the more than two semiconductor chips may be included in the mold resin enveloper (14, 64).

Finally, it will be understood by those skilled in the art that the foregoing description is of preferred embodiments of the package, and that various changes and modifications may be made to the present invention without departing from the spirit and scope thereof.

The invention claimed is:

1. A leadless type semiconductor package comprising:
   a support mount;
   at least one semiconductor chip mounted on said support mount such that a bottom surface of said at least one semiconductor chip is secured to said support mount, said at least one semiconductor chip having at least a first electrode pad and a second electrode pad formed on a top surface thereof, said top surface opposite said bottom surface;
   at least a first flat electrode electrically connected to said first electrode pad and a second flat electrode electrically connected to said second electrode pad; and
   a molded resin enveloper that encapsulates said at least one semiconductor chip, and that partially seals and encapsulates at least said first flat electrode such that a part of said first flat electrode is exposed as an outer electrode pad on a top surface of said molded resin enveloper, the exposed top surface of said part of said first flat electrode being coplanar with the top surface of said molded resin enveloper.

2. The leadless type semiconductor package as set forth in claim 1, wherein at least said first flat electrode is formed with a land portion, which is exposed as the outer electrode pad on the top surface of said molded resin enveloper.

3. The leadless type semiconductor package as set forth in claim 2, wherein said first flat electrode is produced by etching a flat electrode blank, having substantially the same configuration as said first flat electrode, such that said land portion is left on said first flat electrode blank.

4. The leadless type semiconductor package as set forth in claim 1, wherein said support mount is formed of a conductive material, and said at least one semiconductor chip has an electrode layer formed on the bottom surface thereof, with said electrode layer being electrically connected to said support mount.

5. The leadless type semiconductor package as set forth in claim 1, wherein said support mount is at least partially exposed from said molded resin enveloper to thereby provide an outer electrode surface.

6. The leadless type semiconductor package as set forth in claim 1, wherein said support mount is formed with a land portion, which is exposed on the bottom surface of said molded resin enveloper to thereby provide an outer electrode surface.

7. The leadless type semiconductor package as set forth in claim 6, wherein said support mount is produced by etching a support mount blank, having substantially the same configuration as said support mount, such that said land portion is left on said support mount blank.

8. The leadless type semiconductor package as set forth in claim 1, wherein said at least one semiconductor chip is formed as a vertical type power metal oxide semiconductor field effect transistor device, said electrode layer being defined as a drain electrode, said respective first and second flat electrodes being defined as a source electrode and a gate electrode.

9. The leadless type semiconductor package as set forth in claim 1, wherein said at least one semiconductor chip comprises a first semiconductor chip, and a second semiconductor chip, which are substantially to one another and each sealed and encapsulated in said molded resin enveloper in substantially the same manner.

10. The leadless type semiconductor package as set forth in claim 1, wherein said at least one semiconductor chip comprises a first semiconductor chip, and a second semiconductor chip, which is different from said first semiconductor chip, said first and second semiconductor chips being sealed and encapsulated in said molded resin enveloper, said second semiconductor chip having at least one electrode layer formed thereon, and a flat electrode electrically connected to said electrode layer, a part of which is exposed as an outer electrode pad from said molded resin enveloper.

11. A leadless type semiconductor package comprising:
a support mount;
a first semiconductor chip having a bottom surface, a bottom electrode formed on said bottom surface, a top surface opposite to said bottom surface, and an electrode pad formed on said top surface, said first semiconductor chip being mounted on said support mount so that said bottom electrode is electrically connected to said support mount;
a first flat electrode electrically connected to said electrode pad of said first semiconductor chip;
a second semiconductor chip having a bottom surface, a bottom electrode formed on said bottom surface, a top surface opposite to said bottom surface, and an electrode pad formed on said top surface, said second semiconductor chip being mounted on said support mount so that said bottom electrode thereof is electrically connected to said support mount;
a second flat electrode electrically connected to the electrode pad of said second semiconductor chip; and
a molded resin enveloper having a bottom surface, a top surface opposite to said bottom surface, and side surfaces extending between said bottom surface and said top surface,
said molded resin enveloper sealing said first semiconductor chip and said electrode pad of said first semiconductor chip, and partially sealing said support mount and said first flat electrode, so that a part of said first flat electrode is exposed on the top surface of said molded resin enveloper, the exposed top surface of said part of said flat electrode being coplanar with the top surface of said molded resin enveloper, and
said molded resin enveloper sealing said second semiconductor chip, and partially sealing said second flat electrode, so that a part of said second flat electrode is exposed on the top surface of said molded resin enveloper and is coplanar with said top surface of said molded resin enveloper.

12. The leadless type semiconductor package as set forth in claim 11, wherein said electrode pad of said first semiconductor chip is defined as a first electrode pad, said first semiconductor chip having a second electrode pad formed on the top surface thereof, and wherein said flat electrode is defined as a first flat electrode, further comprising:
a second flat electrode electrically connected to said second electrode pad, said second flat electrode being partially sealed, in said molded resin enveloper so that a part of said second flat electrode is exposed on the top surface of said molded resin enveloper and is coplanar with said top surface of said molded resin enveloper.

13. The leadless type semiconductor package as set forth in claim 11, wherein the electrode pad of said first semiconductor chip is defined as a first electrode pad, said first semiconductor chip having a second electrode pad formed on the top surface thereof, and wherein the electrode pad of said second semiconductor chip is defined as a first electrode pad, said second semiconductor chip having a second electrode pad formed an the top surface thereof, further comprising:
a third flat electrode electrically connected to the second electrode pad of said first semiconductor chip, said third flat electrode being partially sealed in said molded resin enveloper so that a part of said third flat electrode is exposed on the top surface of said molded resin enveloper and is coplanar with said top surface of said molded resin enveloper; and
a fourth flat electrode electrically connected to the second electrode pad of said second semiconductor chip, said fourth flat electrode being partially sealed in said molded resin enveloper so that a part of said fourth flat electrode is exposed on the top surface of said molded resin enveloper and is coplanar with said top surface of said molded resin enveloper.

14. The leadless type semiconductor package as set forth in claim 13, wherein said first semiconductor chip is defined as a first vertical type power metal oxide semiconductor field effect transistor, the first and second electrode pads of said first semiconductor chip serving as a source electrode and a gate electrode, respectively, and wherein said second semiconductor chip is defined as a second vertical type power metal oxide semiconductor field effect transistor, the first and second electrode pads of said second semiconductor chip serving as a source electrode and a gate electrode, respectively.

15. The leadless type semiconductor package as set forth in claim 14, wherein the electrical connection between said third flat electrode and the gate electrode of said first semiconductor chip is established without using a bonding wire, and wherein the electrical connection between said fourth and the gate electrode of said second semiconductor chip is established without using a bonding wire.

16. The leadless type semiconductor package as set forth in claim 14, wherein said first, second, third and fourth flat electrode are completely sealed in said molded resin enveloper at the side surface thereof.

17. The leadless type semiconductor package as set forth in claim 11, wherein a part of said support mount is exposed on the bottom surface of said molded resin enveloper.

18. The leadless type semiconductor package as set forth in claim 11, wherein a peripheral edge faces of said support mount are coplanar with the side surface of said molded resin enveloper.

* * * * *